(12) United States Patent
Huang et al.

(10) Patent No.: US 10,784,191 B2
(45) Date of Patent: Sep. 22, 2020

(54) INTERFACE STRUCTURES AND METHODS FOR FORMING SAME

(71) Applicant: INVENSAS BONDING TECHNOLOGIES, INC., San Jose, CA (US)

(72) Inventors: Shaowu Huang, Sunnyvale, CA (US); Belgacem Haba, Saratoga, CA (US); Javier A. DeLaCruz, San Jose, CA (US)

(73) Assignee: Invensas Bonding Technologies, Inc., San Jose, CA (US)

(*) Notice: Subject to any disclaimer, the term of this patent is extended or adjusted under 35 U.S.C. 154(b) by 14 days.

(21) Appl. No.: 15/940,273

(22) Filed: Mar. 29, 2018

(65) Prior Publication Data
US 2018/0286805 A1 Oct. 4, 2018

Related U.S. Application Data

(60) Provisional application No. 62/480,022, filed on Mar. 31, 2017.

(51) Int. Cl.
*H01L 23/522* (2006.01)
*H01L 23/498* (2006.01)
(Continued)

(52) U.S. Cl.
CPC .... *H01L 23/5223* (2013.01); *H01L 23/49811* (2013.01); *H01L 23/5227* (2013.01); *H01L 23/5385* (2013.01); *H01L 24/69* (2013.01); *H01L 25/0657* (2013.01); *H01L 23/49822* (2013.01); *H01L 24/08* (2013.01); *H01L 2224/08147* (2013.01); *H01L 2224/80099* (2013.01); *H01L 2224/80895* (2013.01);
(Continued)

(58) Field of Classification Search
None
See application file for complete search history.

(56) References Cited

U.S. PATENT DOCUMENTS 4,998,665 A 3/1991 Hayashi
5,087,585 A 2/1992 Hayashi
(Continued)

FOREIGN PATENT DOCUMENTS

EP 1 441 410 B1 4/2006
JP 2000-100679 4/2000
(Continued)

OTHER PUBLICATIONS

International Search Report and Written Opinion dated Apr. 23, 2018, issued in International Application No. PCT/US2017/068788, 13 pages.
(Continued)

*Primary Examiner* — Anthony Ho
*Assistant Examiner* — Kevin Quinto
(74) *Attorney, Agent, or Firm* — Knobbe, Martens Olson & Bear, LLP

(57) ABSTRACT

A stacked and electrically interconnected structure is disclosed. The structure can comprise a first element and a second element directly bonded to the first element along a bonding interface without an intervening adhesive. A filter circuit can be integrally formed between the first and second elements along the bonding interface.

24 Claims, 17 Drawing Sheets

(51) Int. Cl.
  *H01L 23/00* (2006.01)
  *H01L 25/065* (2006.01)
  *H01L 23/538* (2006.01)
  *H03H 7/01* (2006.01)
  *H03H 1/00* (2006.01)

(52) U.S. Cl.
  CPC ............... *H01L 2224/80896* (2013.01); *H01L 2224/80948* (2013.01); *H01L 2224/80986* (2013.01); *H01L 2924/30105* (2013.01); *H01L 2924/30107* (2013.01); *H03H 7/0115* (2013.01); *H03H 2001/0078* (2013.01); *H03H 2001/0085* (2013.01)

(56) References Cited

U.S. PATENT DOCUMENTS

| | | |
|---|---|---|
| 5,322,593 A | 6/1994 | Hasegawa et al. |
| 5,408,053 A | 4/1995 | Young |
| 5,471,090 A | 11/1995 | Deutsch et al. |
| 5,753,536 A | 5/1998 | Sugiyama et al. |
| 5,771,555 A | 6/1998 | Eda et al. |
| 5,985,739 A | 11/1999 | Plettner et al. |
| 5,998,808 A | 12/1999 | Matsushita |
| 6,008,126 A | 12/1999 | Leedy |
| 6,080,640 A | 6/2000 | Gardner et al. |
| 6,115,264 A | 9/2000 | Nosaka |
| 6,265,775 B1 | 7/2001 | Seyyedy |
| 6,300,161 B1 | 10/2001 | Goetz et al. |
| 6,374,770 B1 | 4/2002 | Lee |
| 6,418,029 B1 | 7/2002 | McKee et al. |
| 6,423,640 B1 | 7/2002 | Lee et al. |
| 6,465,892 B1 | 10/2002 | Suga |
| 6,638,808 B1 | 10/2003 | Ochi |
| 6,713,871 B2 | 3/2004 | Searls et al. |
| 6,759,692 B1 | 7/2004 | Ochi |
| 6,887,769 B2 | 5/2005 | Kellar et al. |
| 6,908,027 B2 | 6/2005 | Tolchinsky et al. |
| 7,045,453 B2 | 5/2006 | Canaperi et al. |
| 7,078,811 B2 | 7/2006 | Suga |
| 7,105,980 B2 | 9/2006 | Abbott et al. |
| 7,126,212 B2 | 10/2006 | Enquist et al. |
| 7,193,423 B1 | 3/2007 | Dalton et al. |
| 7,339,798 B2 | 3/2008 | Chakravorty |
| 7,354,798 B2 | 4/2008 | Pogge et al. |
| 7,355,836 B2 | 4/2008 | Radhakrishnan et al. |
| 7,705,691 B2 | 4/2010 | Lu et al. |
| 7,741,724 B2 | 6/2010 | Morikawa et al. |
| 7,746,663 B2 | 6/2010 | Hashimoto |
| 7,750,488 B2 | 7/2010 | Patti et al. |
| 7,803,693 B2 | 9/2010 | Trezza |
| 8,183,127 B2 | 5/2012 | Patti et al. |
| 8,241,961 B2 | 8/2012 | Kim et al. |
| 8,314,007 B2 | 11/2012 | Vaufredaz |
| 8,349,635 B1 | 1/2013 | Gan et al. |
| 8,357,931 B2 | 1/2013 | Schieck et al. |
| 8,377,798 B2 | 2/2013 | Peng et al. |
| 8,441,131 B2 | 5/2013 | Ryan |
| 8,476,146 B2 | 7/2013 | Chen et al. |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,524,533 B2 | 9/2013 | Tong et al. |
| 8,620,164 B2 | 12/2013 | Heck et al. |
| 8,647,987 B2 | 2/2014 | Yang et al. |
| 8,697,493 B2 | 4/2014 | Sadaka |
| 8,698,323 B2 | 4/2014 | Mohammed et al. |
| 8,716,105 B2 | 5/2014 | Sadaka et al. |
| 8,802,538 B1 | 8/2014 | Liu |
| 8,809,123 B2 | 8/2014 | Liu et al. |
| 8,841,002 B2 | 9/2014 | Tong |
| 8,916,448 B2 | 12/2014 | Cheng et al. |
| 8,988,299 B2 | 3/2015 | Kam et al. |
| 9,093,350 B2 | 7/2015 | Endo et al. |
| 9,142,517 B2 | 9/2015 | Liu |
| 9,171,756 B2 | 10/2015 | Enquist et al. |
| 9,184,125 B2 | 11/2015 | Enquist et al. |
| 9,224,704 B2 | 12/2015 | Landru |
| 9,230,941 B2 | 1/2016 | Chen et al. |
| 9,257,399 B2 | 2/2016 | Kuang et al. |
| 9,263,186 B2 | 2/2016 | Li et al. |
| 9,299,736 B2 | 3/2016 | Chen et al. |
| 9,312,229 B2 | 4/2016 | Chen et al. |
| 9,331,149 B2 | 5/2016 | Tong et al. |
| 9,337,235 B2 | 5/2016 | Chen et al. |
| 9,368,866 B2 | 6/2016 | Yu |
| 9,385,024 B2 | 7/2016 | Tong et al. |
| 9,391,143 B2 | 7/2016 | Tong et al. |
| 9,394,161 B2 | 7/2016 | Cheng et al. |
| 9,431,368 B2 | 8/2016 | Enquist et al. |
| 9,437,572 B2 | 9/2016 | Chen et al. |
| 9,443,796 B2 | 9/2016 | Chou et al. |
| 9,461,007 B2 | 10/2016 | Chun et al. |
| 9,496,202 B2 | 11/2016 | Hashimoto |
| 9,496,239 B1 | 11/2016 | Edelstein et al. |
| 9,536,848 B2 | 1/2017 | England et al. |
| 9,537,199 B2 | 1/2017 | Dang et al. |
| 9,559,081 B1 | 1/2017 | Lai et al. |
| 9,620,481 B2 | 4/2017 | Edelstein et al. |
| 9,656,852 B2 | 5/2017 | Cheng et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,799,587 B2 | 10/2017 | Fujii et al. |
| 9,852,988 B2 | 12/2017 | Enquist et al. |
| 9,881,882 B2 | 1/2018 | Hsu et al. |
| 9,893,004 B2 | 2/2018 | Yazdani |
| 9,929,050 B2 | 3/2018 | Lin |
| 9,941,241 B2 | 4/2018 | Edelstein et al. |
| 9,941,243 B2 | 4/2018 | Kim et al. |
| 9,953,941 B2 | 4/2018 | Enquist |
| 9,960,142 B2 | 5/2018 | Chen et al. |
| 10,002,844 B1 | 6/2018 | Wang et al. |
| 10,026,605 B2 | 7/2018 | Doub et al. |
| 10,075,657 B2 | 9/2018 | Fahim et al. |
| 10,204,893 B2 | 2/2019 | Uzoh et al. |
| 10,269,756 B2 | 4/2019 | Uzoh |
| 10,276,619 B2 | 4/2019 | Kao et al. |
| 10,276,909 B2 | 4/2019 | Huang et al. |
| 2002/0000328 A1 | 1/2002 | Motomura et al. |
| 2002/0003307 A1 | 1/2002 | Suga |
| 2004/0084414 A1 | 5/2004 | Sakai et al. |
| 2004/0155692 A1 | 8/2004 | Ochi |
| 2005/0135041 A1 | 6/2005 | Kang et al. |
| 2005/0190808 A1 | 9/2005 | Yonekura et al. |
| 2005/0231303 A1 | 10/2005 | Chang et al. |
| 2006/0012966 A1 | 1/2006 | Chakravorty |
| 2006/0017144 A1 | 1/2006 | Uematsu et al. |
| 2006/0057945 A1 | 3/2006 | Hsu et al. |
| 2006/0145778 A1 | 7/2006 | Pleva et al. |
| 2007/0045814 A1 | 3/2007 | Yamamoto et al. |
| 2007/0096294 A1 | 5/2007 | Ikeda et al. |
| 2007/0111386 A1 | 5/2007 | Kim et al. |
| 2007/0147014 A1 | 6/2007 | Chang et al. |
| 2007/0222048 A1 | 9/2007 | Huang |
| 2007/0295456 A1 | 12/2007 | Gudeman et al. |
| 2008/0124835 A1 | 5/2008 | Chen et al. |
| 2009/0206962 A1 | 8/2009 | Chou et al. |
| 2009/0242252 A1 | 10/2009 | Tanaka |
| 2011/0115579 A1 | 5/2011 | Rofougaran |
| 2011/0290552 A1 | 12/2011 | Palmateer et al. |
| 2012/0013499 A1 | 1/2012 | Hayata |
| 2012/0147516 A1 | 6/2012 | Kim et al. |
| 2012/0168217 A1 | 7/2012 | Hsu et al. |
| 2012/0212384 A1 | 8/2012 | Kam et al. |
| 2013/0009325 A1 | 1/2013 | Mori et al. |
| 2013/0063863 A1 | 3/2013 | Timler et al. |
| 2013/0105943 A1 | 5/2013 | Lai et al. |
| 2013/0207234 A1 | 8/2013 | Ikeda et al. |
| 2013/0265733 A1 | 10/2013 | Herbsommer et al. |
| 2013/0286544 A1 | 10/2013 | Azais |
| 2014/0001568 A1 | 1/2014 | Wang et al. |
| 2014/0048908 A1 | 2/2014 | Chen et al. |
| 2014/0116761 A1 | 5/2014 | Lee et al. |

(56) References Cited

U.S. PATENT DOCUMENTS

| | | |
|---|---|---|
| 2014/0145338 A1 | 5/2014 | Fujii et al. |
| 2014/0175629 A1 | 6/2014 | Sun et al. |
| 2014/0175655 A1 | 6/2014 | Chen et al. |
| 2014/0177189 A1* | 6/2014 | Liu .................. H01L 23/481 361/760 |
| 2014/0184351 A1 | 7/2014 | Bae et al. |
| 2014/0225795 A1 | 8/2014 | Yu |
| 2014/0252635 A1 | 9/2014 | Tran et al. |
| 2014/0264751 A1 | 9/2014 | Chen et al. |
| 2014/0264948 A1 | 9/2014 | Chou et al. |
| 2014/0370658 A1 | 12/2014 | Tong et al. |
| 2014/0377946 A1 | 12/2014 | Cha et al. |
| 2015/0064498 A1 | 3/2015 | Tong |
| 2015/0097298 A1 | 4/2015 | Chen et al. |
| 2015/0194379 A1 | 7/2015 | Chen et al. |
| 2015/0206902 A1 | 7/2015 | Cheng et al. |
| 2015/0221571 A1 | 8/2015 | Chaparala et al. |
| 2015/0235952 A1 | 8/2015 | Pan et al. |
| 2015/0270209 A1 | 9/2015 | Woychik et al. |
| 2015/0318618 A1 | 11/2015 | Chen et al. |
| 2016/0077294 A1 | 3/2016 | Jou et al. |
| 2016/0111404 A1 | 4/2016 | Sanders et al. |
| 2016/0155677 A1 | 6/2016 | Bonart et al. |
| 2016/0197630 A1 | 7/2016 | Kawasaki |
| 2016/0233195 A1 | 8/2016 | Nagai |
| 2016/0254345 A1 | 9/2016 | Singh et al. |
| 2016/0309578 A1 | 10/2016 | Park |
| 2016/0343682 A1 | 11/2016 | Kawasaki |
| 2016/0372449 A1 | 12/2016 | Rusu et al. |
| 2017/0019086 A1* | 1/2017 | Dueweke ............. H01F 21/04 |
| 2017/0062366 A1 | 3/2017 | Enquist |
| 2017/0062409 A1 | 3/2017 | Basker et al. |
| 2017/0179029 A1 | 6/2017 | Enquist et al. |
| 2017/0194271 A1 | 7/2017 | Hsu et al. |
| 2017/0200711 A1 | 7/2017 | Uzoh et al. |
| 2017/0338214 A1 | 11/2017 | Uzoh et al. |
| 2017/0343498 A1 | 11/2017 | Kalnitsky et al. |
| 2018/0096931 A1 | 4/2018 | Huang et al. |
| 2018/0174995 A1 | 6/2018 | Wang et al. |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0191047 A1 | 7/2018 | Huang et al. |
| 2018/0219038 A1 | 8/2018 | Gambino et al. |
| 2018/0226375 A1 | 8/2018 | Enquist et al. |
| 2018/0273377 A1 | 9/2018 | Katkar et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2019/0096741 A1 | 3/2019 | Uzoh et al. |
| 2019/0096842 A1 | 3/2019 | Fountain, Jr. et al. |
| 2019/0115277 A1 | 4/2019 | Yu et al. |
| 2019/0131277 A1 | 5/2019 | Yang et al. |
| 2019/0198407 A1 | 6/2019 | Huang et al. |
| 2019/0198409 A1 | 6/2019 | Katkar et al. |
| 2019/0333550 A1 | 10/2019 | Fisch |
| 2019/0348336 A1 | 11/2019 | Katkar et al. |
| 2019/0385966 A1 | 12/2019 | Gao et al. |
| 2020/0013637 A1 | 1/2020 | Haba |
| 2020/0043817 A1 | 2/2020 | Shen et al. |
| 2020/0075534 A1 | 3/2020 | Gao et al. |

FOREIGN PATENT DOCUMENTS

| | | |
|---|---|---|
| JP | 2001-102479 | 4/2001 |
| JP | 2002-353416 | 12/2002 |
| JP | 2003-043281 | 2/2003 |
| JP | 2008-258258 | 10/2008 |
| JP | 2013-33786 | 2/2013 |
| JP | 2018-160519 | 10/2018 |
| KR | 10-2006-0105797 | 10/2006 |
| KR | 10-2015-0097798 | 8/2015 |
| WO | WO 2005/043584 A2 | 5/2005 |
| WO | WO 2005/064646 A2 | 7/2005 |
| WO | WO 2006/100444 A1 | 9/2006 |
| WO | WO 2012/125237 A2 | 9/2012 |
| WO | WO 2017/151442 A1 | 9/2017 |

OTHER PUBLICATIONS

U.S. Appl. No. 15/387,385, filed Dec. 21, 2016, Wang et al.
U.S. Appl. No. 15/395,197, filed Dec. 30, 2016, Huang et al.
U.S. Appl. No. 15/426,942, filed Feb. 7, 2017, DeLaCruz et al.
U.S. Appl. No. 15/709,309, filed Sep. 19, 2017, Huang et al.
U.S. Appl. No. 15/849,383, filed Dec. 20, 2017, Enquist et al.
U.S. Appl. No. 15/856,391, filed Dec. 28, 2017, Haba et al.
U.S. Appl. No. 15/940,273, filed Mar. 29, 2018, Huang et al.
Amirfeiz et al., "Formation of silicon structures by plasma-activated wafer bonding," Journal of the Electrochemical Society, 2000, vol. 147, No. 7, pp. 2693-2698.
Chung et al., "Room temperature GaAseu+Si and InPeu+Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.
Chung et al., "Wafer direct bonding of compound semiconductors and silicon at room temperature by the surface activated bonding method," Applied Surface Science, Jun. 2, 1997, vols. 117-118, pp. 808-812.
Farrens et al., "Chemical free room temperature wafer to wafer direct bonding," J. Electrochem. Soc., The Electrochemical Society, Inc., Nov. 1995, vol. 142, No. 11. pp. 3949-3955.
Farrens et al., "Chemical free wafer bonding of silicon to glass and sapphire," Electrochemical Society Proceedings vol. 95-7, 1995, pp. 72-77.
Gösele et al., "Semiconductor Wafer Bonding: A flexible approach to materials combinations in microelectronics; micromechanics and optoelectronics," IEEE, 1997, pp. 23-32.
Hosoda et al., "Effect of the surface treatment on the room-temperature bonding of Al to Si and SiO2," Journal of Materials Science, Jan. 1, 1998, vol. 33, Issue 1, pp. 253-258.
Hosoda et al., "Room temperature GaAs—Si and InP—Si wafer direct bonding by the surface activated bonding method," Nuclear Inst. and Methods in Physics Research B, 1997, vol. 121, Nos. 1-4, pp. 203-206.
Howlader et al., "A novel method for bonding of ionic wafers," Electronics Components and Technology Conference, 2006, IEEE, pp. 7-pp.
Howlader et al., "Bonding of p-Si/n-InP wafers through surface activated bonding method at room temperature," Indium Phosphide and Related Materials, 2001, IEEE International Conference on, pp. 272-275.
Howlader et al., "Characterization of the bonding strength and interface current of p-Si/ n-InP wafers bonded by surface activated bonding method at room temperature," Journal of Applied Physics, Mar. 1, 2002, vol. 91, No. 5, pp. 3062-3066.
Howlader et al., "Investigation of the bonding strength and interface current of p-SionGaAs wafers bonded by surface activated bonding at room temperature," J. Vac. Sci. Technol. B 19, Nov./Dec. 2001, pp. 2114-2118.
International Search Report and Written Opinion dated May 29, 2017, issued in International Application No. PCT/US2016/067182, 14 pages.
Itoh et al., "Characteristics of fritting contacts utilized for micromachined wafer probe cards," 2000 American Institute of Physics, AIP Review of Scientific Instruments, vol. 71, 2000, pp. 2224.
Itoh et al., "Characteristics of low force contact process for MEMS probe cards," Sensors and Actuators A: Physical, Apr. 1, 2002, vols. 97-98, pp. 462-467.
Itoh et al., "Development of MEMS IC probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.

(56) References Cited

OTHER PUBLICATIONS

Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.
Jeon, Y. et al., "Design of an on-interposer passive equalizer for high bandwidth memory (HBM) with 30Gbps data transmission," Electronic Components and Technology Conference (ECTC), 2016 IEEE 66th, Aug. 18, 2016.
Kim et al., "Low temperature direct Cu—Cu bonding with low energy ion activation method," Electronic Materials and Packaging, 2001, IEEE, pp. 193-195.
Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.
Kim et al., "Wafer-scale activated bonding of Cu—Cu, Cu—Si, and Cu—SiO2 at low temperature," Proceedings—Electrochemical Society, 2003, vol. 19, pp. 239-247.
Kim, H. et al., "A wideband on-interposer passive equalizer design for chip-to-chip 30-Gb/s serial data transmission," IEEE Transactions on Components, Packaging and Manufacturing Technology, Jan. 2015, vol. 5, Issue 1, pp. 28-39.
Lee, H. et al., "Signal integrity of bump-less high-speed through silicon via channel for terabyte/s bandwidth 2.5D IC," 2016 IEEE 66th Electronic Components and Technology Conference, Aug. 18, 2016.
Matsuzawa et al., "Room-temperature interconnection of electroplated Au microbump by means of surface activated bonding method," Electornic Components and Technology Confererence, 2001, 51st Proceedings, IEEE, pp. 384-387.
Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.
Reiche et al., "The effect of a plasma pretreatment on the Si/Si bonding behaviouir," Electrochemical Society Proceedings, 1998, vol. 97-36, pp. 437-444.
Roberds et al., "Low temperature , in situ, plasma activated wafer bonding," Electrochecmical Society Proceedings, 1997, vol. 97-36, pp. 598-606.
Shigetou et al., "Room temperature bonding of ultra-fine pitch and low-profiled Cu electrodes for bump-less interconnect," 2003 Electronic Components and Technology Conference, pp. 848-852.
Shigetou et al., "Room-temperature direct bonding of CMP-Cu film for bumpless interconnection," Electronic Components and Technology Confererence, 51st Proceedings, 2001, IEEE, pp. 755-760.
Shingo et al., "Design and fabrication of an electrostatically actuated MEMS probe card," Tranducers, Solid-State Sensors, Actuators and Microsystems, 12th International Conference, Jun. 8-12, 2003, vol. 2, pp. 1522-1525.
Suga et al., "A new approach to Cu—Cu direct bump bonding," IEMT/IMC Symposium, 1997, Joint International Electronic Manufacturing Symposium and the International Microelectronics Conference, Apr. 16-18, 1997, IEEE, pp. 146-151.
Suga et al., "A new bumping process using lead-free solder paste," Electronics Packaging Manufacturing, IEEE Transactions on (vol. 25, Issue 4), IEEE, Oct. 2002, pp. 253-256.
Suga et al., "A new wafer-bonder of ultra-high precision using surface activated bonding (SAB) concept," Electronic Components and Technology Conference, 2001, IEEE, pp. 1013-1018.
Suga et al., "Bump-less interconnect for next generation system packaging," Electronic Components and Technology Conference, 2001, IEEE, pp. 1003-1008.
Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.
Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.
Suga et al., "Surface activated bonding—an approach to joining at room temperature," Ceramic Transactions: Structural Ceramics Joining II, The American Ceramic Society, 1993, pp. 323-331.
Suga et al., "Surface activated bonding for new flip chip and bumpless interconnect systems," Electronic Components and Technology Conference, 2002, IEEE, pp. 105-111.
Suga, "UHV room temperature joining by the surface activated bonding method," Advances in science and technology, Techna, Faenza, Italie, 1999, pp. C1079-C1089.
Takagi et al., "Effect of surface roughness on room-temperature wafer bonding by Ar beam surface activation," Japanese Journal of Applied Physics, 1998, vol. 37, Part 1, No. 1, pp. 4197.
Takagi et al., "Low temperature direct bonding of silicon and silicon dioxide by the surface activation method," Solid State Sensors and Actuators, 1997, Transducers '97 Chicago, 1997 International Conference, vol. 1, pp. 657-660.
Takagi et al., "Room-temperature bonding of lithium niobate and silicon wafers by argon-beam surface activation," Appl. Phys. Lett., 1999. vol. 74, pp. 2387.
Takagi et al., "Room temperature silicon wafer direct bonding in vacuum by Ar beam irradiation," Micro Electro Mehcanical Systems, MEMS '97 Proceedings, 1997, IEEE, pp. 191-196.
Takagi et al., "Room-temperature wafer bonding of Si to LiNbO3, LiTaO3, and Gd3Ga5O12 by Ar-beam surface activation," Journal of Micromechanics and Microengineering, 2001, vol. 11, No. 4, pp. 348.
Takagi et al., "Room-temperature wafer bonding of silicon and lithium niobate by means of arbon-beam surface activation," Integrated Ferroelectrics: An International Journal, 2002, vol. 50, Issue 1, pp. 53-59.
Takagi et al., "Surface activated bonding silicon wafers at room temperature," Appl. Phys. Lett. 68, 2222 (1996).
Takagi et al, "Wafer-scale room-temperature bonding between silicon and ceramic wafers by means of argon-beam surface activation," Micro Electro Mechanical Systems, 2001, MEMS 2001, The 14th IEEE International Conference, Jan. 25, 2001, IEEE, pp. 60-63.
Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.
Tong et al., "Low temperature wafer direct bonding," Journal of Microelectomechanical systems, Mar. 1994, vol. 3, No. 1, pp. 29-35.
Topol et al., "Enabling technologies for wafer-level bonding of 3D MEMS and integrated circuit structures," 2004 Electronics Components and Technology Conference, 2004 IEEE, pp. 931-938.
Wang et al., "Reliability and microstructure of Au—Al and Au—Cu direct bonding fabricated by the Surface Activated Bonding," Electronic Components and Technology Conference, 2002, IEEE, pp. 915-919.
Wang et al., "Reliability of Au bump—Cu direct interconnections fabricated by means of surface activated bonding method," Microelectronics Reliability, May 2003, vol. 43, Issue 5, pp. 751-756.
Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.
Westphal, W.B. et al., "Dielectric constant and loss data," Air Force Materials Laboratory, Apr. 1972.
Xu et al., "New Au—Al interconnect technology and its reliability by surface activated bonding," Electronic Packaging Technology Proceedings, Oct. 28-30, 2003, Shanghai, China, pp. 479-483.
Ceramic Microstructures: Control at the Atomic Level, Recent Progress in Surface Activated Bonding, 1998, pp. 385-389.
International Search Report and Written Opinion dated Jan. 9, 2018, issued in International Application No. PCT/US2017/052409, 19 pages.

(56) References Cited

OTHER PUBLICATIONS

International Search Report and Written Opinion dated Jul. 17, 2018, issued in International Application No. PCT/US2018/025241, 15 pages.
International Search Report and Written Opinion dated Mar. 22, 2018, issued in International Application No. PCT/US2017/064735, 13 pages.
International Search Report and Written Opinion dated Mar. 7, 2019, in International Application No. PCT/US2018/060044, 14 pages.
International Search Report and Written Opinion dated Apr. 22, 2019 in International Application No. PCT/US2018/064982, 13 pages.
Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.
Moriceau, H. et al., "Overview of recent direct wafer bonding advances and applications," Advances in Natural Sciences—Nanoscience and Nanotechnology, 2010, 11 pages.
Nakanishi, H. et al., "Studies on SiO2—SiO2 bonding with hydrofluoric acid. Room temperature and low stress bonding technique for MEMS," Sensors and Actuators, 2000, vol. 79, pp. 237-244.
Oberhammer, J. et al., "Sealing of adhesive bonded devices on wafer level," Sensors and Actuators A, 2004, vol. 110, No. 1-3, pp. 407-412, see pp. 407-412, and Figures 1(a)-1(l), 6 pages.
Plobi, A. et al., "Wafer direct bonding: tailoring adhesion between brittle materials," Materials Science and Engineering Review Journal, 1999, R25, 88 pages.

\* cited by examiner

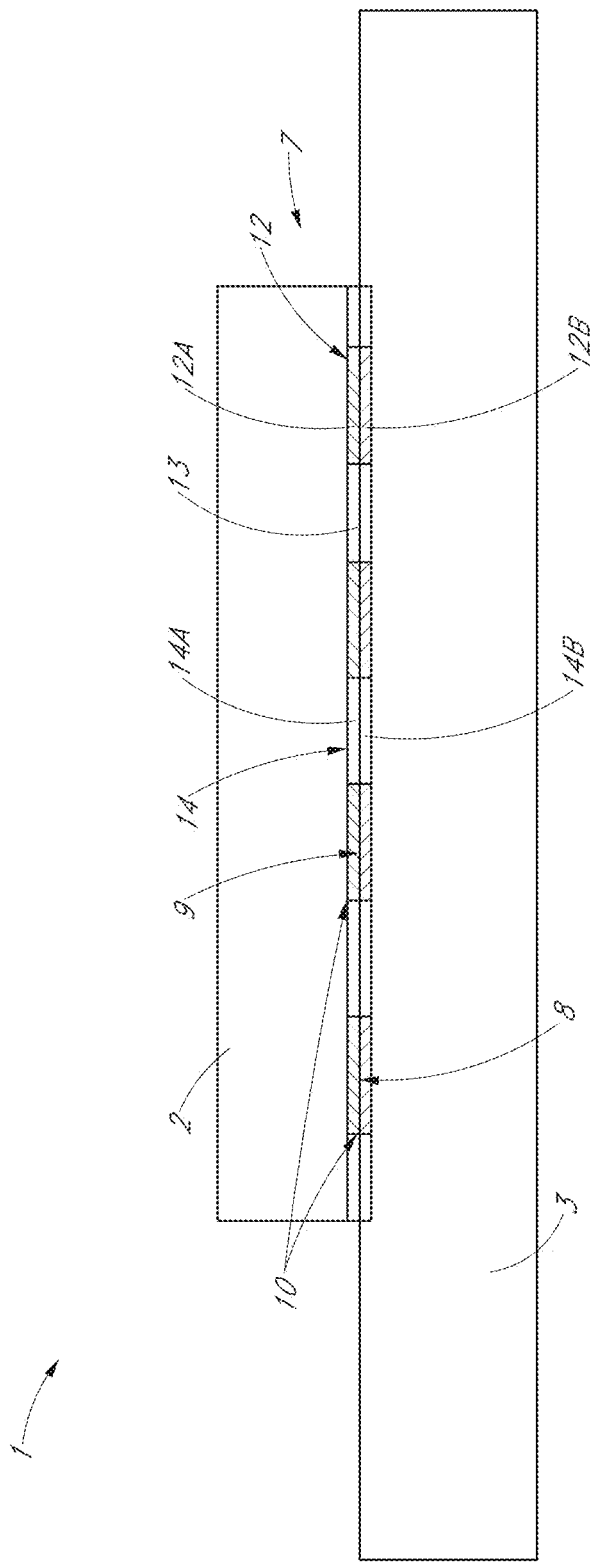

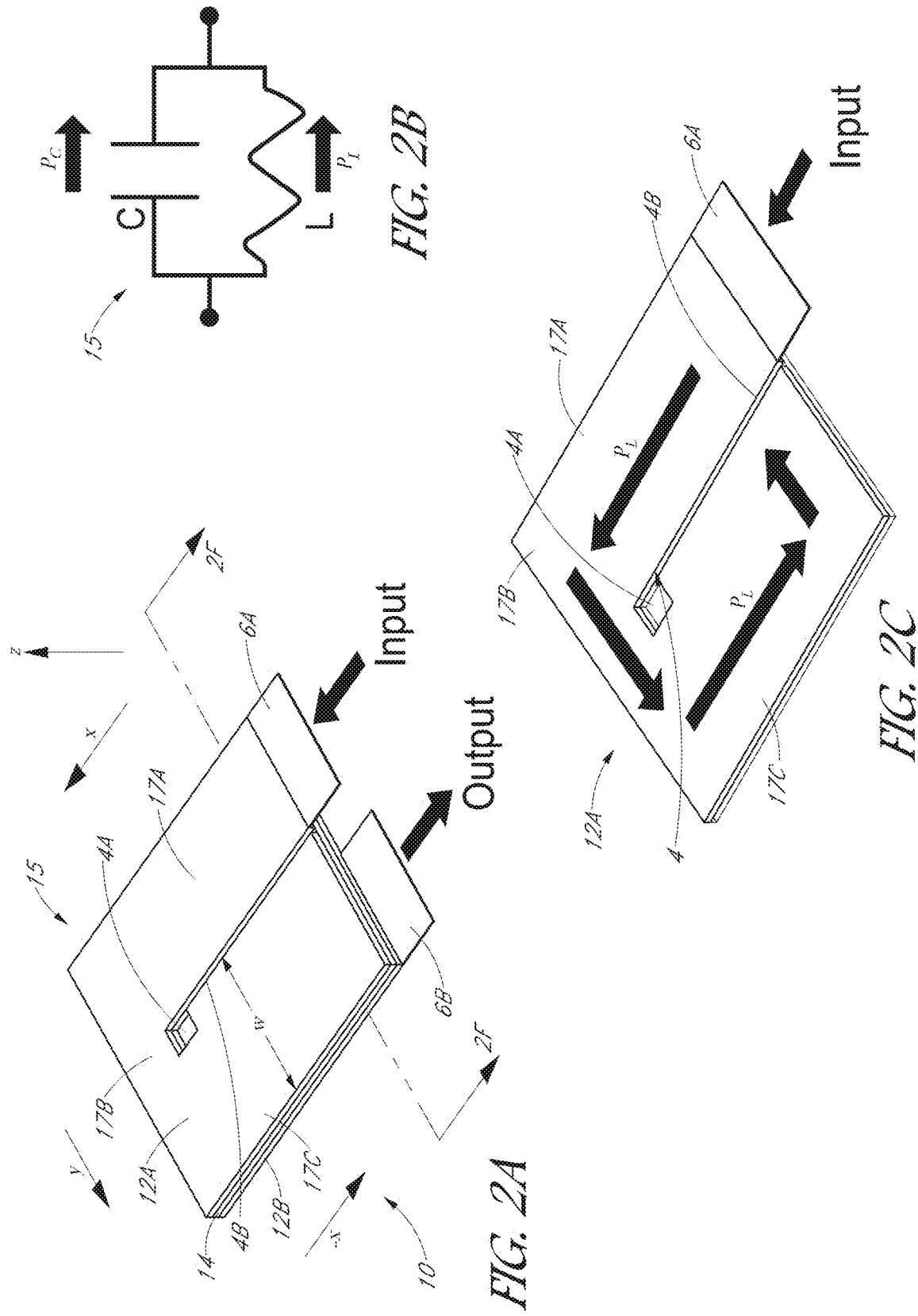

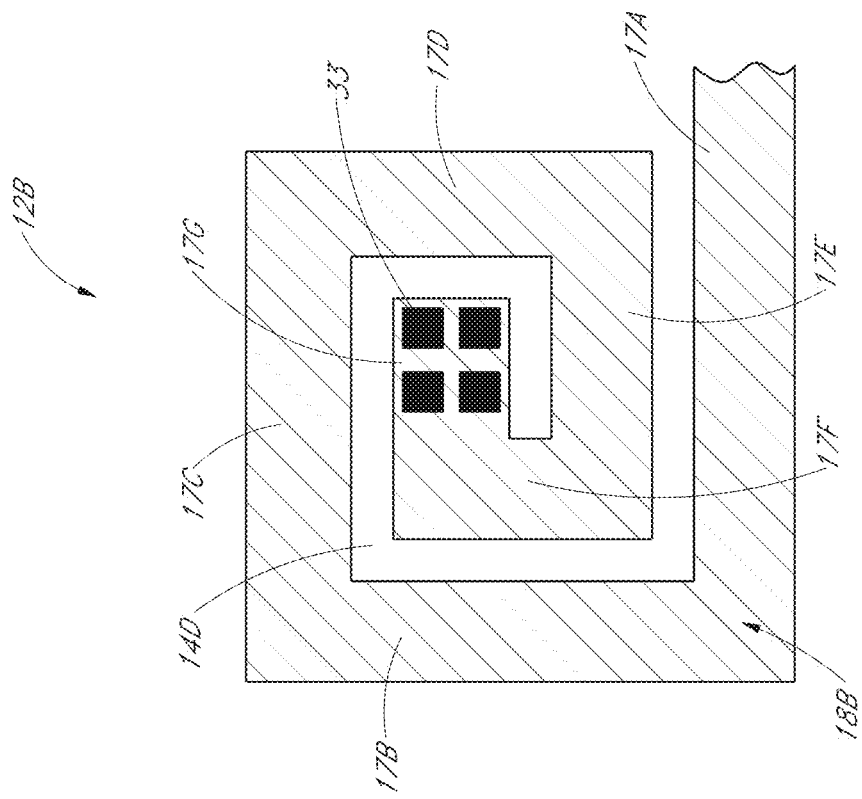
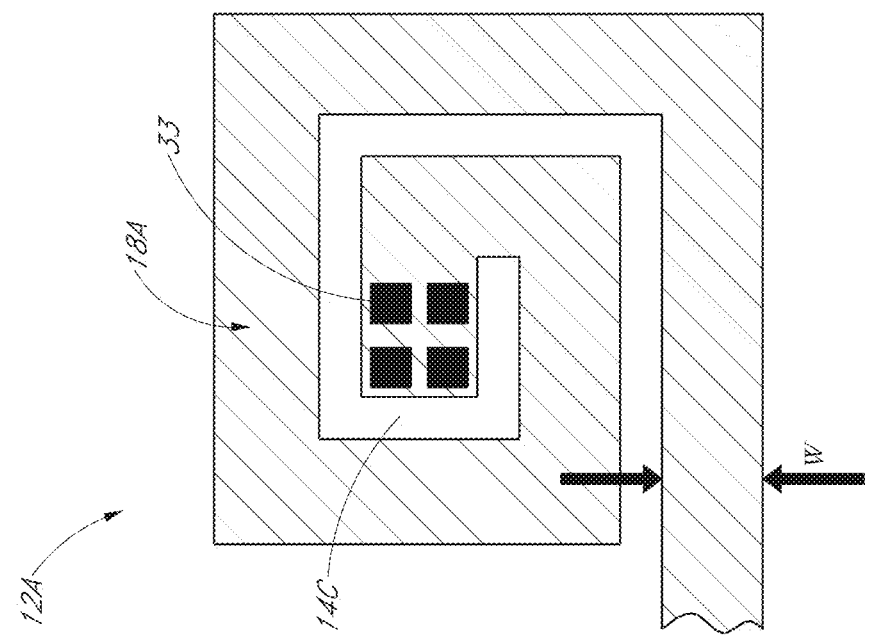
FIG. 4B
FIG. 4A

INTERFACE STRUCTURES AND METHODS FOR FORMING SAME

CROSS-REFERENCE TO RELATED APPLICATIONS

This application claims priority to U.S. Provisional Patent Application No. 62/480,022, filed on Mar. 31, 2017, the entire contents of which are incorporated by reference herein in their entirety and for all purposes. This application is related to U.S. patent application Ser. No. 15/709,309, Sep. 19, 2017, the entire contents of which are incorporated by reference herein in their entirety and for all purposes.

BACKGROUND

Field

The field relates to stacked and electrically interconnected structures and methods for forming the same. In particular, the field relates to elements (such as semiconductor dies) that are connected with an interface structure that defines a filter.

Description of the Related Art

Passive electronic components can be important at the system board level (e.g., motherboard level), at the package level, and/or at the device chip level. In various systems, passive components can be used to filter electrical signals so as to pass signals across one or more bands of frequencies and/or to attenuate (or block) signals across one or more bands of other frequencies. In some electronic devices, discrete passive components such as resistors, capacitors, and/or inductors may be mounted to the system board and/or to the package substrate in order to filter the electrical signals. However, the use of such discrete passive components may occupy valuable space in the package or the larger electronic device or system.

Accordingly, there remains a continuing need for improved incorporation of electrical components such as passive components into electronic systems or packages

BRIEF DESCRIPTION OF THE DRAWINGS

FIG. 1A is a schematic side view of a device that includes a stacked and electrically interconnected structure, according to various embodiments.

FIG. 2A is a schematic perspective view of an interface structure comprising a filter device, according to various embodiments.

FIG. 2B is a schematic circuit diagram of the filter device of FIG. 2A.

FIG. 2C is a schematic perspective view of a first conductive interface feature of the interface structure shown in FIG. 2A.

FIG. 4A is a schematic top plan view of a first conductive interface feature, according to various embodiments.

FIG. 4B is a schematic top plan view of a second conductive interface feature, according to various embodiments.

DETAILED DESCRIPTION

Figure 1B:
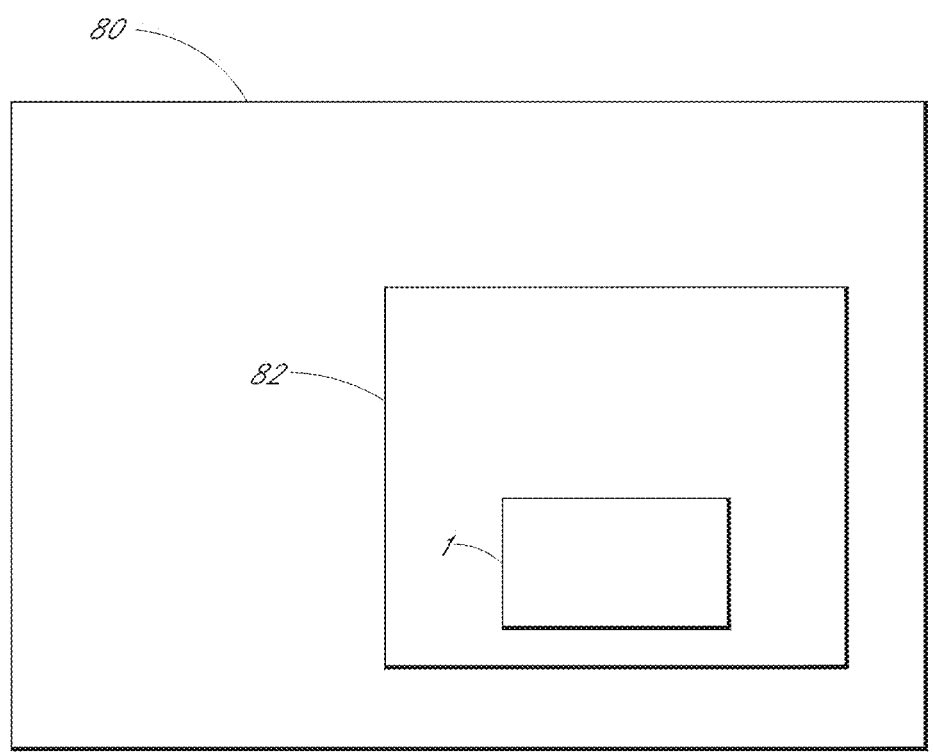
FIG. 1B is a schematic diagram of an electronic system incorporating one or more devices with stacked and electrically interconnected structures, according to various embodiments.

Various embodiments disclosed herein relate to interface structures between two bonded elements (e.g., two bonded semiconductor elements) that can serve as passive filters to selectively attenuate (e.g., block or reduce) and/or pass electrical signals at various bands of frequencies. For example, one or more electronic components, particularly passive components, can be incorporated on an element, such as a semiconductor element, by way of direct bonding without an intervening adhesive. In some embodiments, two semiconductor elements can be patterned with conductive and non-conductive features such that, when the two semiconductor elements are bonded together (e.g., by way of direct bonds), the corresponding patterns mate to define one or a plurality of passive components between the bonded semiconductor elements. Beneficially, therefore, the embodiments disclosed herein can integrate electronic components, and particularly passive components (such as resistors, capacitors, inductors, or combinations thereof), into the bonded interface structure between the two semiconductor elements. While examples are provided for bonding semiconductor elements, the skilled artisan will appreciate that the principles and advantages taught herein are applicable to the bonding of other electronic circuit or device elements that may or may not include semiconductor materials. The integration of passive components into the interface region can advantageously enable smaller devices and/or packages, since the passive components need not be separately provided on the device die or on the package substrate. Rather, the passive components can be integrated with the mechanical and/or electrical connections formed along the bonded interface. Furthermore, the incorporation of a filter into the interface between bonded elements can improve the coupling of analog electronic devices to digital electronic devices. For example providing the passive devices (e.g., passive filters) electrically close to the circuits can significantly improve electrical performance. Moreover, as explained herein, conventional passive components (e.g., surface mount components) occupy a large portion of package or board space. Incorporating these passive components into the bonding layer (e.g., the interface structure) can reduce costs and the lateral footprint of the package or device, particularly as compared with larger passive surface mount components such as inductors.

In some embodiments, as explained herein, each of the two elements to be bonded can be defined with corresponding patterns, and the passive components can be defined along the bonded interface of the two elements. In some embodiments, the passive components can be defined in layers formed on one of the elements, and the one element can be bonded to the other element in any suitable manner, e.g., by direct bonding, or with an adhesive. In other embodiments, the passive components can be defined partially by layers formed on one element and partially in layers formed on another element, which layers can be bonded (e.g., direct bonded or bonded with an adhesive) to one another.

FIG. 1A is a schematic side view of a device 1 that includes a stacked and electrically interconnected structure 7 (also referred to herein as stacked structures) according to various embodiments. The stacked structure 7 can comprise a first element 2 mounted to a second element 3. As explained herein, in some embodiments, the first element 2 can be directly bonded to the second element 3 without an intervening adhesive. In other embodiments, however, an adhesive (e.g., an epoxy, solder, etc.) can be used to mount the first element 2 to the second element 3. The first element 2 can comprise any suitable type of element, such as a semiconductor element (e.g., an integrated device die or chip, an interposer, etc.), an optical element, etc. For example, in some embodiments, the first element 2 can comprise an integrated device die, such as a memory die, a processor die, a microelectromechanical systems (MEMS) die, a sensor die, etc. Similarly, the second element 3 can comprise any suitable type of element, such as a semiconductor element (e.g., an integrated device die or chip, an interposer, etc.), an optical element, etc. For example, in some embodiments, the second element 3 can comprise an integrated device die, such as a memory die, a processor die, a microelectromechanical systems (MEMS) die, a sensor die, etc. In other embodiments, the second element 3 can comprise an interposer or a package substrate (e.g., a laminate or printed circuit board substrate, a ceramic substrate, etc.).

As shown in FIG. 1A, the device 1 can comprise one or a plurality of interface structures 10 that mechanically and electrically connect the first and second elements 2, 3. The interface structure 10 can provide a mechanical and electrical connection between the elements 2, 3. As explained herein, the interface structure 10 can be patterned or formed to define various types of passive electronic components, such as inductors and capacitors, which can be arranged to filter electrical signals. The interface structure 10 can comprise one or a plurality of conductive features 12 and one or a plurality of non-conductive features 14. In some embodiments, the conductive and non-conductive features 12, 14 may be patterned entirely on one of the elements 2, 3, and, when the elements 2, 3 are bonded, the interface structure 10 can comprise the features 12, 14. In the illustrated embodiment, however, the first element 2 can comprise first conductive features 12A and first non-conductive features 14A. The second element 3 can comprise second conductive features 12B and second non-conductive features 14B. When the first and second elements 2, 3 are bonded, the first and second conductive features 12A, 12B can be bonded to define the conductive feature 12, and the first and second non-conductive features 14A, 14B can be bonded to define the non-conductive feature 14.

The interface structures 10 disclosed and illustrated herein can include filters or other passive electronic devices along the bonding interface between the elements 2, 3. It should be appreciated that other types of connections, besides the illustrated filters 15, may also be provided between the elements 2, 3 (e.g., along the bonding interface). For example, in the embodiments disclosed herein, direct metal connections between corresponding bond pads of the elements 2, 3 may also be provided, e.g., to transfer signals between the dies. In the disclosed embodiments, therefore, through-signal connections, power supply connections, ground connections, or other electrical connections may be provided across the bonding interface between the elements 2, 3.

In the embodiments disclosed herein, the interface structures 10 can be formed or defined during wafer-level fabrication processes. For example, in some embodiments, the interface structures 10 (e.g., the conductive and/or nonconductive features 12, 14 disclosed herein) can be fabricated as layer(s) with semiconductor processing techniques (e.g., deposition, lithography, etc.), before dicing of the wafer into elements or chips. In some embodiments, the interface structures 10 (e.g., the conductive and/or nonconductive features 12, 14) can be fabricated as part of the elements 2, 3 (e.g. as part of a semiconductor chip or die), and/or as part of a redistribution layer (RDL) of the elements 2, 3. In some embodiments, the interface structures 10 can be provided along respective bonding surfaces of the elements 2, 3. In other embodiments, the interface structures 10 can be provided between bond pads of the elements 2, 3 and the outer surface (e.g., a bonding surface) of the elements 2, 3.

In the illustrated embodiment, the first and second elements 2, 3 can be directly bonded to one another without an intervening adhesive, to define a direct bond interface 13. In such embodiments, the interface structure 10 can comprise conductive and non-conductive features 12, 14 patterned to define a passive device such as a filter. To accomplish the direct bonding, in some embodiments, respective bonding surfaces 8, 9 of the first and second elements 2, 3 (e.g., bonding surfaces of the conductive features 12A, 12B, and of the non-conductive features 14A, 14B) can be prepared for bonding. The bonding surfaces 8, 9 of the conductive and non-conductive features 12, 14 of the interface structure 10 can be polished to a very high degree of smoothness (e.g., less than 20 nm surface roughness, or more particularly, less than 5 nm surface roughness). In some embodiments, the surfaces to be bonded may be terminated with a suitable species and activated prior to bonding. For example, in some embodiments, the non-conductive surfaces 14A, 14B to be bonded may be very lightly etched for activation and exposed to a nitrogen-containing solution and terminated with a nitrogen-containing species. As one example, the surfaces to be bonded (e.g., non-conductive field regions 14A, 14B) may be exposed to an ammonia dip after a very slight etch, and/or a nitrogen-containing plasma (with or without a separate etch).

In some embodiments, the conductive features 12A, 12B of the first and second elements 2, 3 can be flush with the exterior surfaces (e.g., the non-conductive features 14A, 14B) of the respective elements 2, 3. In other embodiments, the conductive features 12A, 12B may extend above the exterior surfaces (e.g., the non-conductive features 14A, 14B) of the respective elements 2, 3. In still other embodiments, the conductive features 12A, 12B can be recessed relative to the exterior surfaces (e.g., non-conductive features 14A, 14B) of the respective elements 2, 3.

Once the respective bonding surfaces 2, 3 are prepared, the non-conductive features 14A of the first element 2 can be brought into contact with corresponding non-conductive features 14B of the second element 3. The interaction of the activated surfaces can cause the non-conductive features 14A of the first element 2 to directly bond with the corresponding non-conductive features 14B of the second element 3 without an intervening adhesive, without application of external pressure, without application of voltage, and at room temperature. In various embodiments, the bonding forces of the non-conductive features 14A, 14B can include covalent bonds that are greater than Van der Waals bonds and exert significant forces between the conductive features 12A, 12B. Regardless of whether the conductive features 12A, 12B are flush with the nonconductive features 14A, 14B, recessed or protrude, direct bonding of the nonconductive features 14A, 14B can facilitate direct metal-to-metal bonding between the conductive features 12A, 12B. In various embodiments, the elements 2, 3 may be heated after bonding to strengthen the bonds between the nonconductive features 14A, 14B, between the conductive features 12A, 12B, and/or between opposing conductive and non-conductive regions, to cause the elements 2, 3 to bond to one another, to form a direct electrical and mechanical connection.

Additional details of the direct bonding processes used in conjunction with each of the disclosed embodiments may be found throughout U.S. Pat. Nos. 7,126,212; 8,153,505; 7,622,324; 7,602,070; 8,163,373; 8,389,378; and 8,735,219, and throughout U.S. Patent Publication Nos. US 2017/0062366; US 2017/0200711; and US 2017/0338214, the contents of each of which are hereby incorporated by reference herein in their entirety and for all purposes. In other embodiments, however, the elements 2, 3 can be directly electrically connected using a conductive adhesive. For example, in such other embodiments, the conductive features of the interface structure 10 can be connected together using a conductive epoxy, solder, or any other suitable conductive adhesive.

FIG. 1B is a schematic diagram of an electronic system 80 incorporating one or more devices 1 with stacked and electrically interconnected structures 7, according to various embodiments. The system 80 can comprise any suitable type of electronic device, such as a mobile electronic device (e.g., a smartphone, a tablet computing device, a laptop computer, etc.), a desktop computer, an automobile or components thereof, a stereo system, a medical device, a camera, or any other suitable type of system. In some embodiments, the electronic system 80 can comprise a microprocessor, a graphics processor, an electronic recording device, or digital memory. The system 80 can include one or more device packages 82 which are mechanically and electrically connected to the system 80, e.g., by way of one or more motherboards. Each package 82 can comprise one or more devices 1. The system 80 shown in FIG. 1B can comprise any of the stacked structures 7 shown and described herein.

In some devices, it can be challenging to integrated filters into the packaging structure. For example, in some devices, the filter may be surface mounted to the package substrate and/or to the system motherboard. In such arrangements, the filter may occupy valuable space on the package substrate or board, which may increase the overall lateral area or footprint of the device. Furthermore, analog devices formed in Group III-IV semiconductor materials may not utilize a high number of layers. In some Group III-IV analog devices, for example, only one to three layers may be used. Embodiments disclosed herein may utilize stacked and electrically connected structures 7 that can be directly bonded to one another without an intervening adhesive, which can beneficially increase the overall layer count for Group III-IV semiconductor devices. Further, in the disclosed embodiments, package and/or board space may be conserved by providing the filter devices in the interface structure 10 between the elements 2, 3.

Figure 2D:
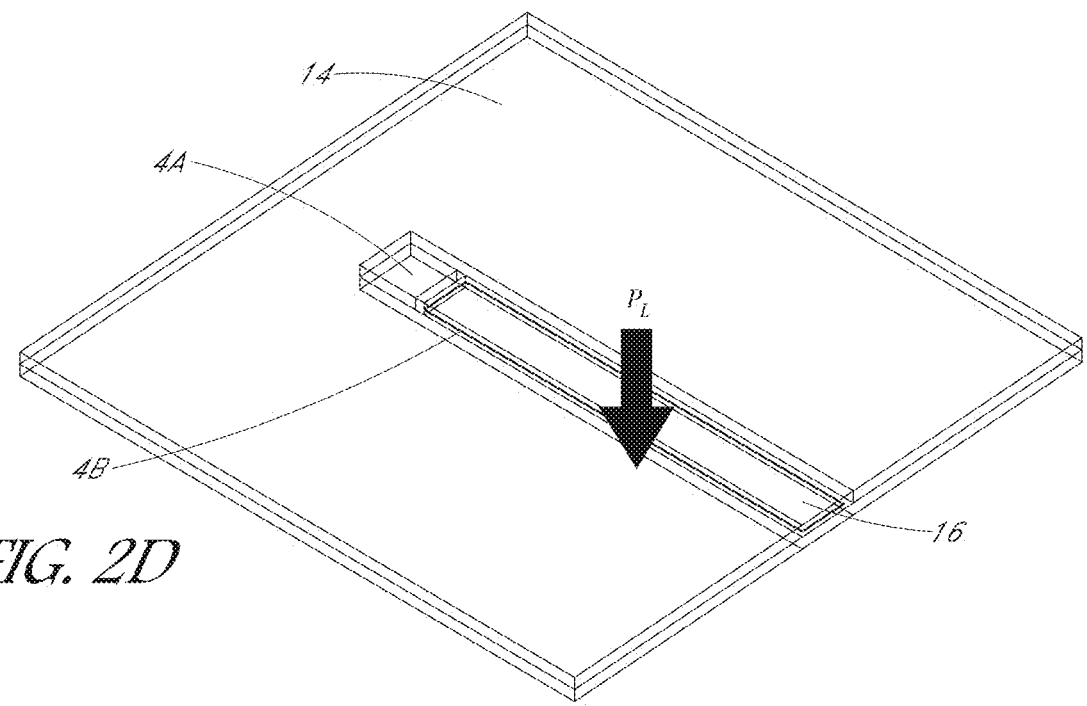
FIG. 2D is a schematic perspective view of an intermediate non-conductive feature with a conductive interconnect that is incorporated into the interface structure of FIG. 2A.
Figure 2E:
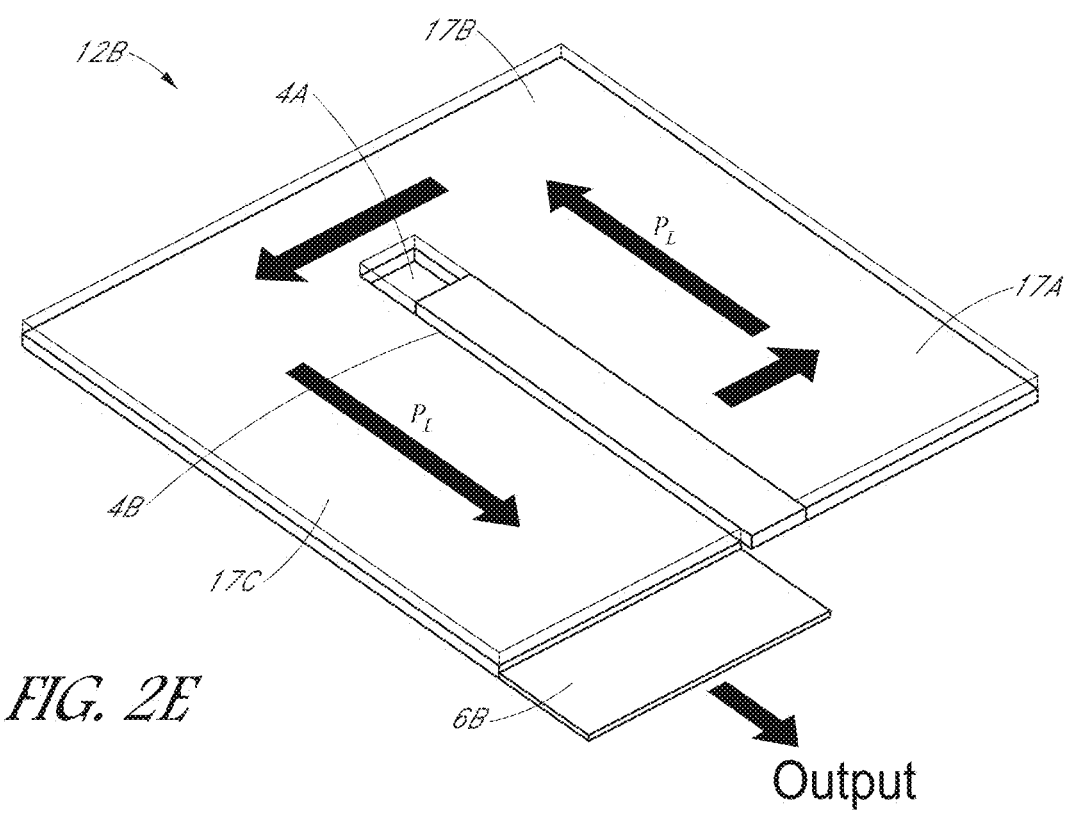
FIG. 2E is a schematic perspective view of a second conductive interface feature of the interface structure shown in FIG. 2A.
Figure 2F:
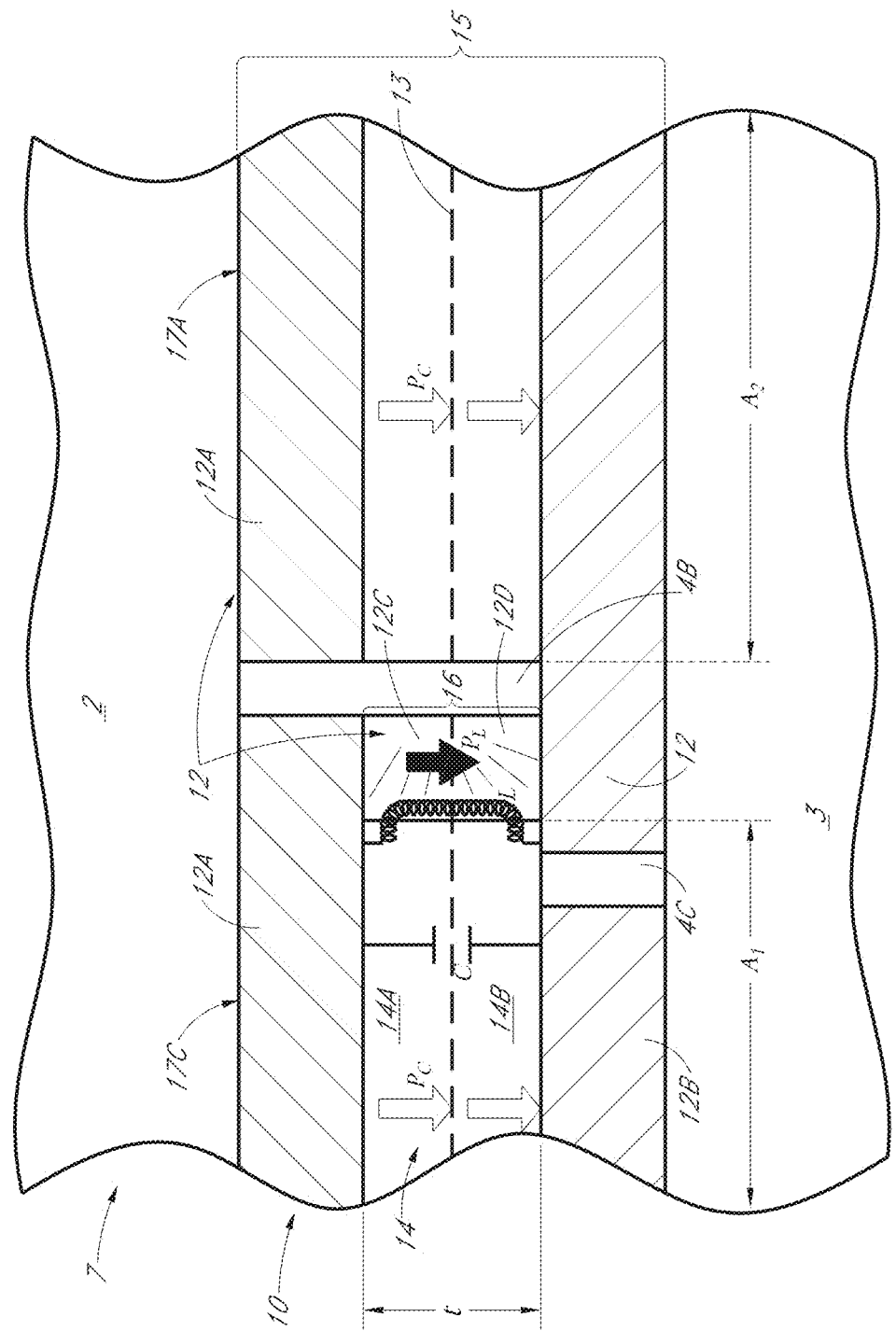
FIG. 2F is a schematic side cross-sectional view of a portion of the interface structure of FIG. 2A.

FIG. 2A is a schematic perspective view of an interface structure 10 comprising a filter device 15, according to various embodiments. FIG. 2B is a schematic circuit diagram of the filter device 15 of FIG. 2A. FIG. 2C is a schematic perspective view of a first conductive interface feature 12A of the interface structure 10 shown in FIG. 2A. FIG. 2D is a schematic perspective view of an intermediate non-conductive feature 14 with a conductive interconnect 16 that is incorporated into the interface structure 10 of FIG. 2A. FIG. 2E is a schematic perspective view of a second conductive interface feature 12B of the interface structure 10 shown in FIG. 2A. FIG. 2F is a schematic side cross-sectional view of a portion of the interface structure 10 of FIG. 2A.

As shown, the interface structure 10 of FIG. 2A can comprise the first conductive feature 12A, the second conductive feature 12B, and the non-conductive feature 14 disposed between the first and second conductive features 12A, 12B. As shown in the equivalent circuit diagram of FIG. 2B, the interface structure 10 can serve as a filter 15, which can be modeled as an inductor L in parallel with a capacitor C. As explained below in connection with FIG. 2H, the filter 15 of FIGS. 2A-2F can serve as a band-reject filter that attenuates (e.g., reduces or blocks the amplitude of) an electrical signal at a desired frequency or range of frequencies.

As illustrated in FIGS. 2A and 2C-2E, the interface structure can comprise a plurality of segments 17A, 17B, 17C, which traverse a plurality of turns about a vertical axis z of the structure 10. As shown the vertical axis z can be approximately perpendicular to the direct bond interface 13 and/or to the major lateral dimension of the elements 2, 3. The segments 17A-17C can turn about the z axis in a particular direction, e.g., clockwise or counterclockwise. As shown, the first segment 17A can extend along the x-direction, the second segment 17B can extend from the first segment 17A along they-direction, and the third segment 17C can extend from the second segment 17B along the −x-direction. Further, as shown in FIGS. 2C and 2E, an insulating gap 4 can electrically separate the segments 17A-17C laterally so as to direct current around the z-axis. As shown, for example, the gap 4 can comprise a first insulating gap region 4A lying in a region between the first, second, and third segments 17A-17C. A second insulating gap region 4B can extend along the −x direction from the first gap region 4A and can electrically separate the first and third segments 17A, 17C. The insulating gap can comprise any suitable insulating material, e.g., silicon oxide. Providing the insulating gap regions 4A, 4B between the segments 17A-17C in the manner shown in FIGS. 2A and 2C-2E can beneficially enable electrical current to flow along the turns of the conductive features 12A, 12B, which can create an inductance L for the filter 15.

Thus, as shown in the model of FIG. 2B, the filter 15 can comprise an inductive current pathway $P_L$ and a capacitive current pathway $P_C$ (see FIG. 2F) in parallel with the inductive current pathway $P_L$. As explained above, and as shown in FIGS. 2A-2C, the turning of the segments 17A-17C in the first conductive feature 12A can generate an inductive pathway $P_L$ along the segments 17A-17C of the first feature 12A. For example, as shown in FIGS. 2A and 2C, current can be introduced into the interface structure 10 by way of an input terminal 6A and can exit the interface structure 10 by way of an output terminal 6B. The inductive pathway $P_L$ can pass along the first segment 17A, the second segment 17B, and the third segment 17C. Directing the current along the turns of the first conductive feature 12A can generate at least a portion of the inductance L for the filter 15.

As shown in FIG. 2D and in the cross-section of FIG. 2F, the non-conductive feature 14 can be disposed or sandwiched between the first and second conductive features 12A, 12B. In the illustrated embodiment, the first conductive feature 12A can be applied or formed on the first element 2, and the second conductive feature 12B can be applied or formed on the second element 3. Furthermore, the non-conductive feature 14 shown in FIG. 2D can comprise a first non-conductive feature 14A applied or formed on the first element 2 (e.g., on the first conductive feature 12A). The non-conductive feature 14 can further comprise a second non-conductive feature 14B applied or formed on the second element 3 (e.g., on the second conductive feature 12B). When the first and second elements 2, 3 are bonded to form the direct bond interface 13, the first and second non-conductive features 14A, 14B can cooperate to define the non-conductive feature 14.

As shown in FIGS. 2D and 2F, a conductive interconnect 16 can be provided through the non-conductive interface feature 14 from the first conductive feature 12A to the second conductive feature 12B. The conductive interconnect 16 can serve as a direct electrical connection, or short, between the conductive features 12A, 12B. The inductive pathway $P_L$ can accordingly extend from the first conductive feature 12A, through the interconnect 16, to the second conductive feature 12B. As shown in FIG. 2F, the second conductive feature 12B can extend underneath the insulating gap region 4B (for example, as shown in FIG. 2F, the right portion of conductive feature 12B can extend underneath the gap region 4B and extend leftward laterally beyond the interconnect 16). A third insulating gap region 4C can be provided in the second conductive feature 12B. As illustrated in FIG. 2F, the conductive interconnect 16 can comprise a third conductive feature 12C provided adjacent the first non-conductive feature 14A and over the first conductive feature 12A. The conductive interconnect 16 can further comprise a fourth conductive feature 12D provided adjacent the second non-conductive feature 14B and over the second conductive feature 12B. As with the non-conductive features 14A, 14B, the third and fourth conductive features 12C, 12D can be directly bonded to one another without an intervening adhesive to form a part of the direct bond interface 13.

Thus, in the illustrated embodiment, the first and third conductive features 12A, 12C, and the first non-conductive feature 14A can be provided on the first element 2, and the second and further conductive features 12B, 12D, and the second non-conductive feature 14B can be provided on the second element 3. In other embodiments, however, more or fewer layers may be provided on each element 2, 3. For example, in some embodiments, the entire filter 15 may be provided on only one of the elements 2, 3. In other embodiments, some of the conductive and/or non-conductive features may be provided on one element, and other of the conductive and/or non-conductive features may be provided on the other element.

Turning to FIG. 2E, the inductive pathway $P_L$ can pass vertically from the first conductive feature 12A, through the interconnect 16, and into the second conductive feature 12B. In FIG. 2F, for example, the inductive pathway $P_L$ can extend laterally to the portion of the conductive feature 12B shown on the right hand side of FIG. 2F. As with the first conductive feature 12A, the second conductive feature 12B can comprise a plurality of turns, in which the segments 17A-17C define the turns around the z-axis. The inductive pathway $P_L$ can traverse along the segments 17A-17C and around the insulating gap region 4A. In some embodiments, the inductive pathway $P_L$ can extend counterclockwise (or clockwise) around both conductive features 12A, 12B. In other embodiments, the pathway $P_L$ may extend in opposite directions (e.g., clockwise in one conductive feature and counterclockwise in the other direction). The inductive pathway $P_L$ can exit the interface structure 10 through the output terminal 6B and can be routed to other structures or circuits in the second element 3.

Returning to FIG. 2F, the capacitor C of the model circuit of FIG. 2B can be defined by the first and second conductive features 12A, 12B and the intervening non-conductive feature 14. Thus, as shown in FIG. 2F, the first conductive feature 12A can serve as a first terminal of the capacitor C, the second conductive feature 12B can serve as a second terminal of the capacitor C, and the non-conductive feature 14 can serve as the intervening dielectric. Accordingly, the capacitive electrical pathway $P_C$ can extend vertically from the first conductive feature 12A, through the non-conductive feature 14, to the second conductive feature 12B. As above, the conductive pathway $P_C$ can exit the interface structure 10 through the output terminal 6B.

Thus, as explained herein, the interface structure 10 disclosed herein can provide an inductive electrical pathway $P_L$ in parallel to a capacitive electrical pathway $P_C$. As explained above, the inductive electrical pathway $P_L$ can extend around the turns of the segments 17A-17C of the first and second conductive features 12A, 12B. The interconnect 16 can provide an electrical connection between the first and second conductive features 12A, 12B. The capacitive electrical pathway $P_C$ can extend through the thickness of the interface structure 10, e.g., from the first conductive feature 12A, through the non-conductive feature 14, to the second conductive feature 12B.

In various embodiments, the conductive features 12A-12D and non-conductive features 14A-14B can be patterned to have the desired inductance L and capacitance C values to form the filter 15 for passing and/or attenuating signals at various bands. In various embodiments, the conductive features 12A-12D and non-conductive features 14A-14B can be patterned to have any suitable or desired inductance L. In various embodiments, the conductive features 12A-12D and non-conductive features 14A-14B can be patterned to have any suitable capacitance C. The inductance L can be tuned in various ways. For example, in some embodiments, the number of turns or segments 17A-17C along the first and second conductive features 12A, 12B can be selected so as to achieve the desired inductance L. In some embodiments, a width w of the segments 17A-17C can be selected so as to achieve the desired inductance L. For example, the width w of the segments 17A-17C can be in a range of 0.1 microns to 2 microns. In some embodiments, a thickness of the conductive features 12A, 12B and/or the nonconductive features 14 may also be selected so as to achieve the desired inductance L.

Similarly, the capacitance C can be tuned in a variety of ways. For example, the capacitance C can be selected based on one or more of, e.g., a thickness t of the non-conductive feature 14, an area A of the conductive features 12A, 12B (which can comprise the sum of $A_1$ and $A_2$ shown in FIG. 2F so as to account for the area covered by the conductive interconnect 16), and/or the material to be used for the metallic and/or non-metallic features 12, 14. In various embodiments, for example, the thickness t of the non-conductive feature 14 can be in a range of 0.1 microns to 2 microns. The overall area A can be selected to achieve the desired capacitance C, with the overall area $A=A_1+A_2$, so as to account for the area covered by the conductive interconnect 16.

The conductive features 12A, 12B can comprise any suitable conductive material, including metals such as copper, aluminum, gold, silver, metal alloys, other metals, etc. In some embodiments, the conductive features 12A, 12B can comprise surface layers, such as barrier layers (e.g., a metal nitride barrier material, such as a titanium nitride barrier material). The non-conductive features 14A, 14B can comprise any suitable non-conductive or dielectric material, such as silicon oxide.

Figure 2G:
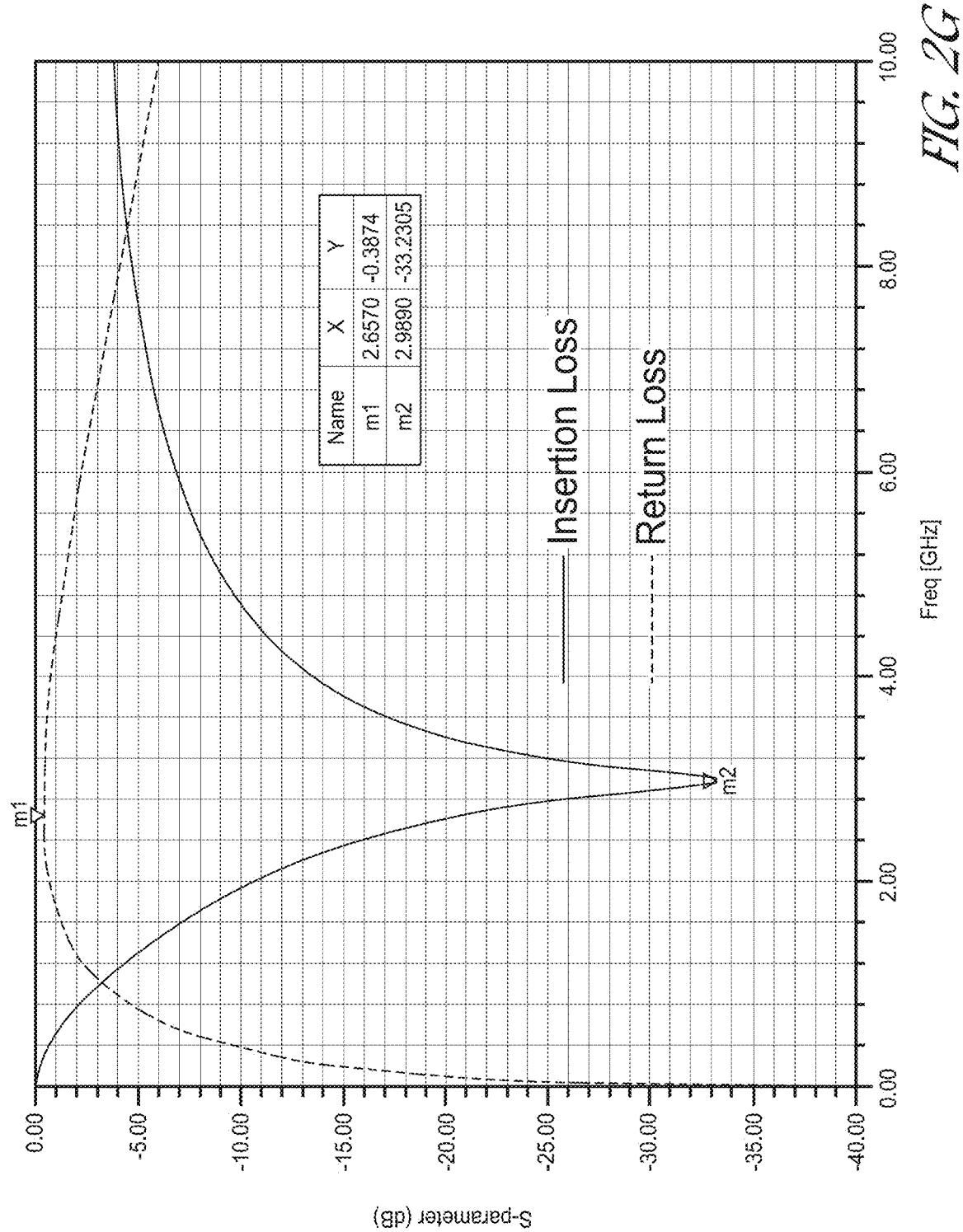
FIG. 2G is a graph of gain versus frequency for a conventional band-reject filter.
Figure 2H:
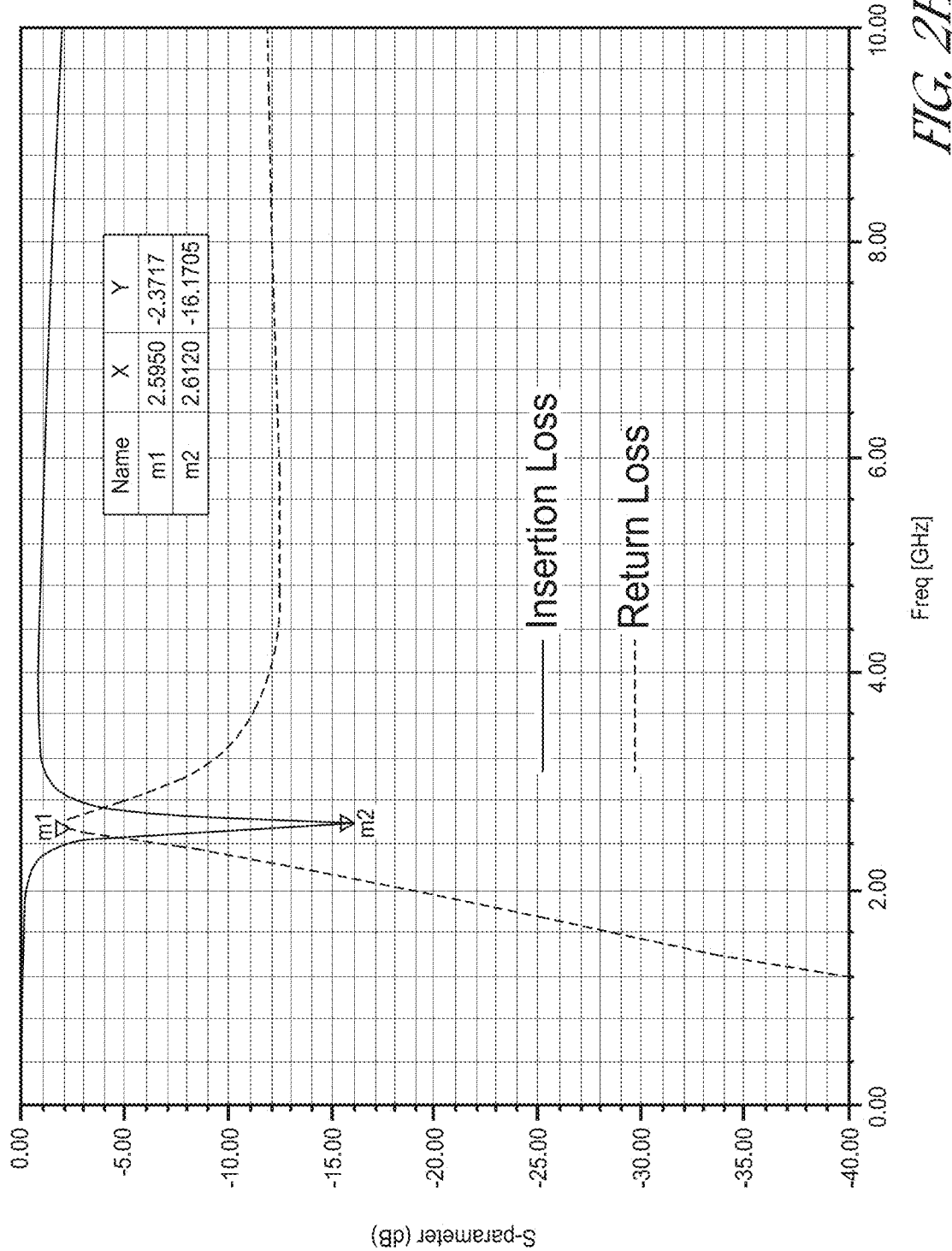
FIG. 2H is a graph of gain versus frequency for the filter shown and described in FIGS. 2A-2F.

FIG. 2G is a graph of gain versus frequency for a conventional band-reject filter. FIG. 2H is a graph of gain versus frequency for the filter 15 shown and described in FIGS. 2A-2F. The embodiment of FIGS. 2A-2F can beneficially serve as a band-reject filter or resonator in which signals at one or a plurality of frequencies are rejected or attenuated, and signals at other frequencies are passed or transmitted. As shown by the insertion loss plot of FIG. 2H, electrical signals at frequencies in a reject band between about 2.2 GHz and about 2.4 GHz can be attenuated, while electrical signals at frequencies outside this reject band can be passed with little or negligible transmission losses. Beneficially, the performance of the filter 15 shown in FIG. 2H (e.g., the filter 15 of FIGS. 2A-2F) can provide a relatively narrow reject band that can accurately and selectively reject or attenuate certain frequencies. For example, it is desirable to have finite, well-defined bands for frequency rejection. Having a narrow band (or multiple narrow bands) may improve the performance of the filter. By contrast, in the conventional filter of FIG. 2G, the insertion loss plot indicates that frequencies across a much wider band of frequencies (e.g., 2 GHz to 4 GHz) may be attenuated. For example, the shallower, sloping range of FIG. 2G may not perform as well as the filter of FIG. 2H, since FIG. 2G includes wider bands for rejection, which makes filtering of undesirable bands and maintenance of desired bands more challenging. Thus, the embodiments disclosed herein enable for higher selectivity filters that may be provided along the bond interface between two elements.

Figure 3A:
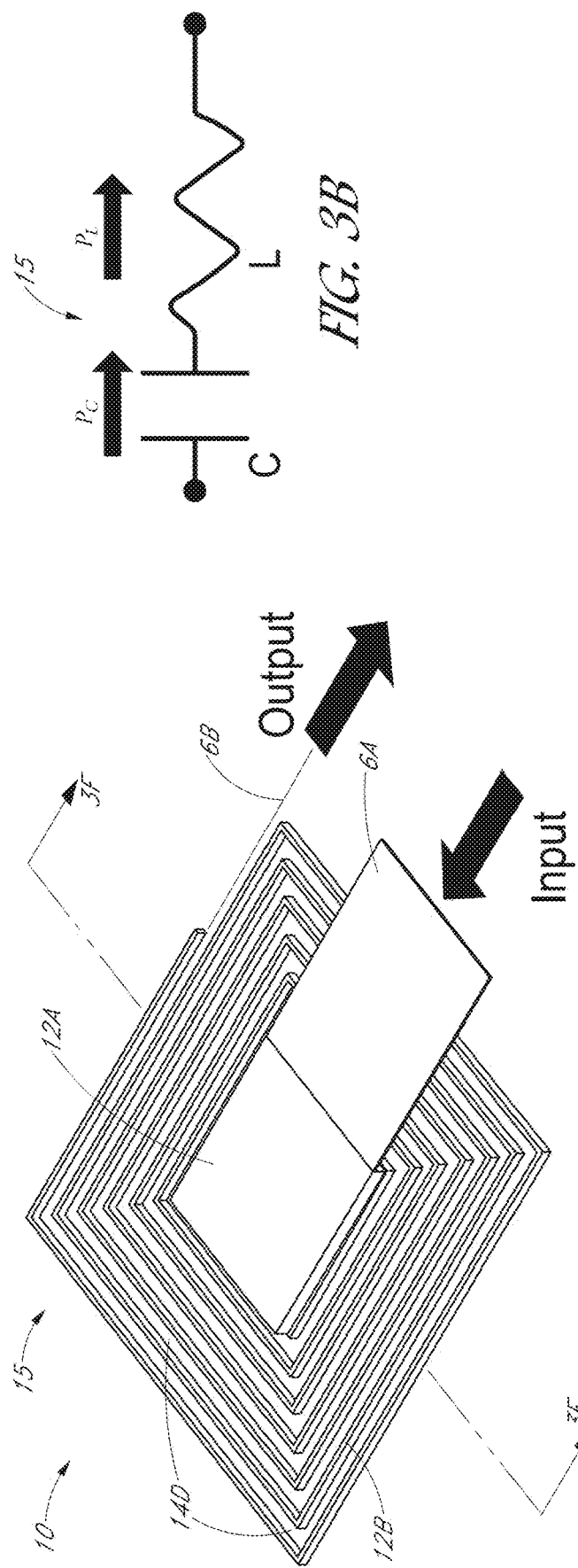
FIG. 3A is a schematic perspective view of an interface structure comprising a filter device that can be modeled by an inductor in series with a capacitor, according to various embodiments.
Figure 3B:
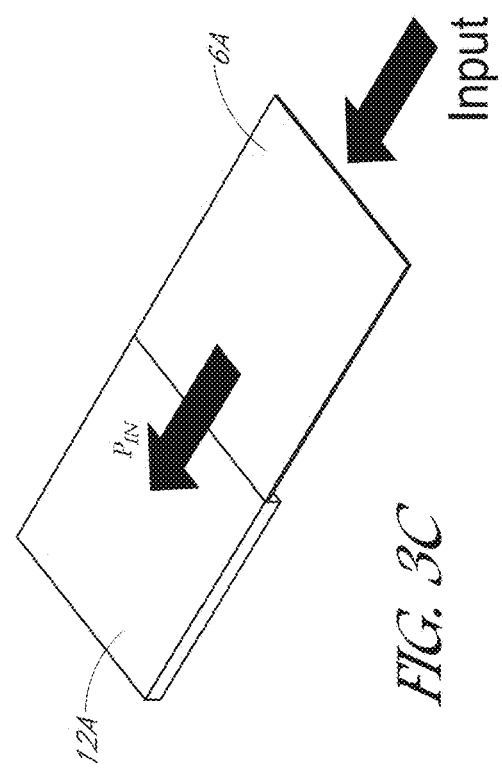
FIG. 3B is a schematic circuit diagram of the filter device of FIG. 3A.
Figure 3C:
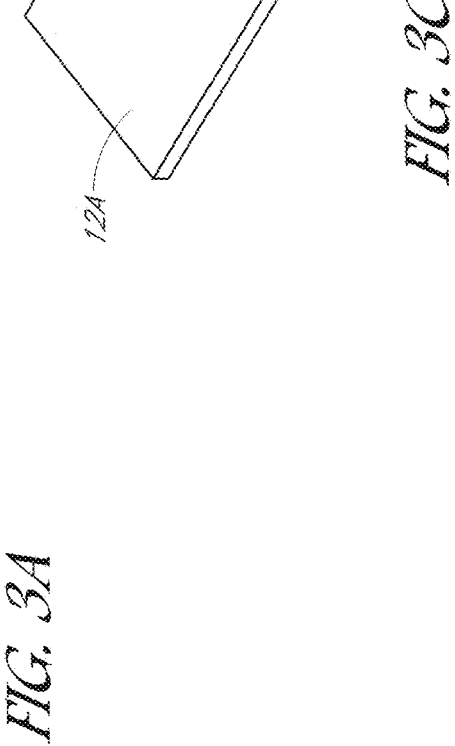
FIG. 3C is a schematic perspective view of a first conductive interface feature of the interface structure shown in FIG. 3A.
Figure 3D:
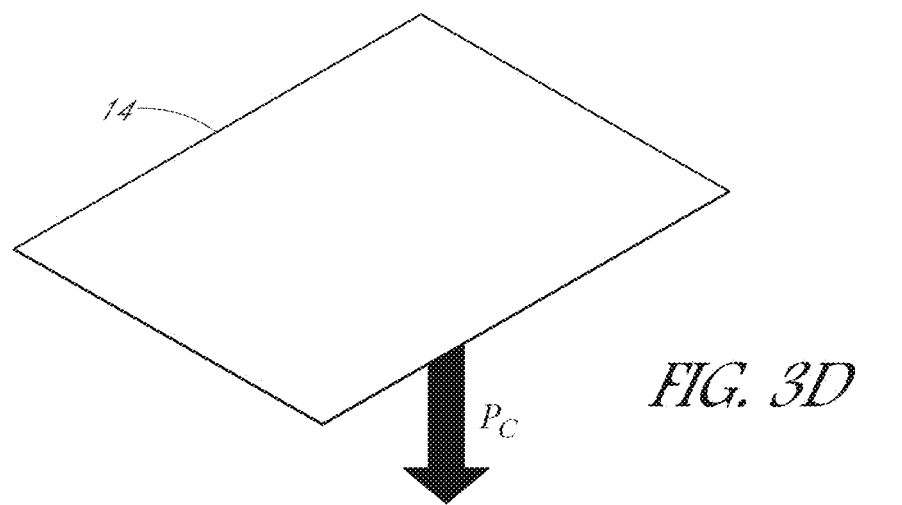
FIG. 3D is a schematic perspective view of an intermediate non-conductive feature with a conductive interconnect that is incorporated into the interface structure of FIG. 3A.
Figure 3E:
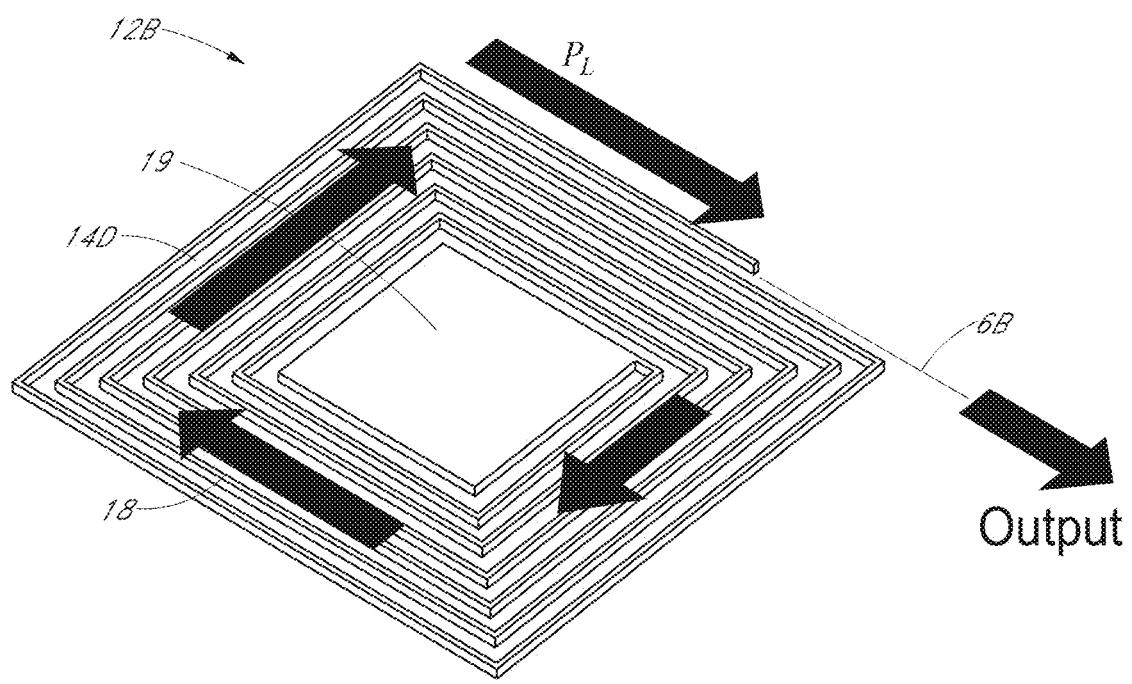
FIG. 3E is a schematic perspective view of a second conductive interface feature of the interface structure shown in FIG. 3A.
Figure 3F:
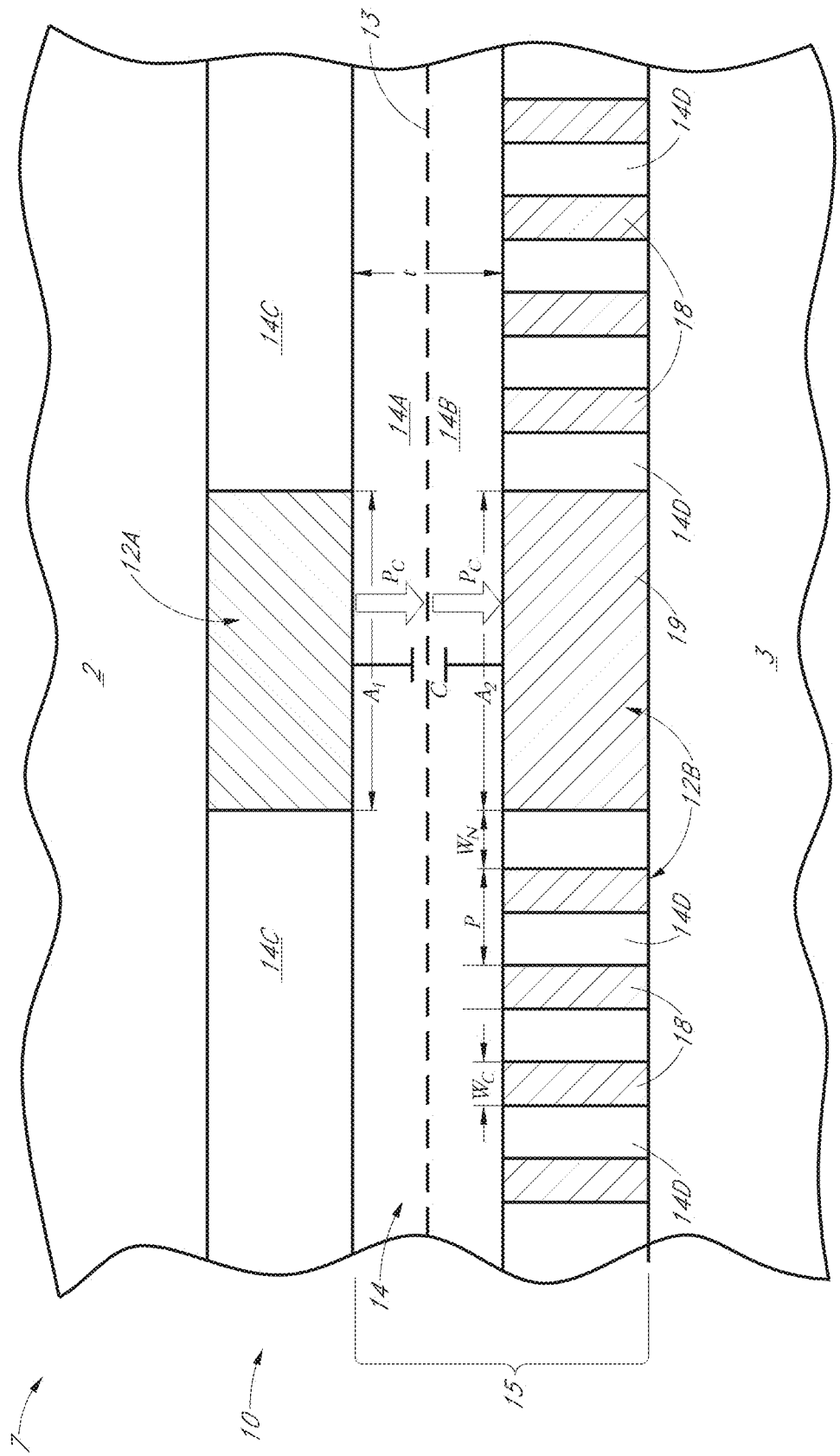
FIG. 3F is a schematic side cross-sectional view of a portion of the interface structure of FIG. 3A.

FIGS. 3A-3G illustrate other embodiments of filters 15 that can be formed in accordance with various embodiments disclosed herein. FIG. 3A is a schematic perspective view of an interface structure 10 comprising a filter device 15 that can be modeled by an inductor in series with a capacitor, according to various embodiments. FIG. 3B is a schematic circuit diagram of the filter device 15 of FIG. 3A. FIG. 3C is a schematic perspective view of a first conductive interface feature 12A of the interface structure 10 shown in FIG. 3A. FIG. 3D is a schematic perspective view of an intermediate non-conductive feature 14 with a conductive interconnect 16 that is incorporated into the interface structure 10 of FIG. 3A. FIG. 3E is a schematic perspective view of a second conductive interface feature 12B of the interface structure 10 shown in FIG. 3A. FIG. 3F is a schematic side cross-sectional view of a portion of the interface structure 10 of FIG. 3A. Unless otherwise noted, components shown in FIGS. 3A-3F may be the same as or generally similar to like-numbered components of FIGS. 2A-2F.

Figure 3G:
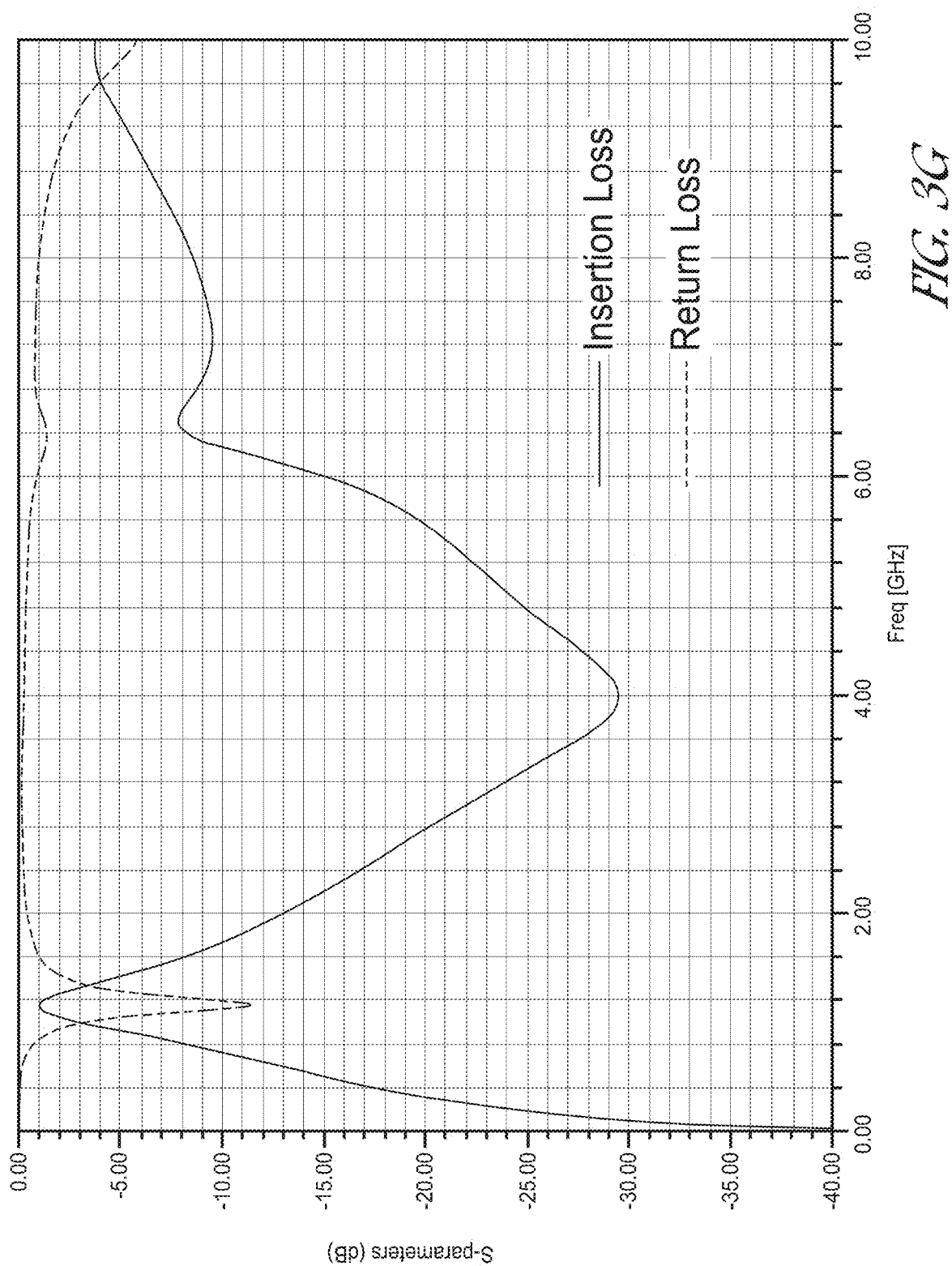
FIG. 3G is a graph of gain versus frequency for the filter shown and described in FIGS. 3A-3F.

As with the embodiment of FIGS. 2A-2F, the interface structure 10 of FIG. 3A-3F can comprise a first conductive feature 12A, a second conductive feature 12B, and an intervening non-conductive feature 14 disposed or sandwiched between the conductive features 12A, 12B, to define the filter device 15. Unlike the embodiment of FIGS. 2A-2F (which can be modeled as a capacitor C in parallel with an inductor L), in the embodiment of FIGS. 3A-3F, the filter device 15 can be modeled as a capacitor C in series with an inductor L. Further, unlike the embodiment of FIGS. 2A-2F, the filter device 15 can serve as a bandpass filter or resonator, in which electrical signals at a band of one or more frequencies are passed, while signals with frequencies outside the band are attenuated (e.g., blocked or reduced in amplitude), as shown in FIG. 3G.

As shown in FIG. 3C, the first conductive feature 12A can electrically communicate with the input terminal 6A. The first conductive feature 12A can comprise any suitable size or shape, and can serve as an electrical input pad to the filter 15. Turning to FIGS. 3D-3F, the non-conductive feature 14 can be provided between the first conductive feature 12A and the second conductive feature 12B. As with the embodiment of FIGS. 2A-2F, the non-conductive feature 14 can comprise a first non-conductive feature 14A provided on the first element 2 (e.g., over the first conductive feature 12A), and a second non-conductive feature 14B provided on the second element 3 (e.g., over the second conductive feature 12B). Furthermore, as shown in FIG. 3F, a third non-conductive feature 14C can be disposed about the first conductive feature 12A. When the elements 2, 3 are bonded, the first and second non-conductive features 14A, 14B can be directly bonded along the direct bond interface 13 to define the intervening non-conductive feature 14. As explained above, however, in some embodiments, more or fewer layers may be provided on each element 2, 3. For example, as explained above, the first conductive feature 12A, the non-conductive feature 14, and the second conductive feature 12B can be provided on only one of the elements. Other combinations may be suitable.

As shown in FIG. 3F, the capacitive electrical pathway $P_C$ can extend from the first conductive feature 12A, down through the non-conductive feature 14, to the second conductive feature 12B. As shown in FIGS. 3A, 3E, and 3F, the second conductive feature 12B can comprise a pad portion 19 and a coil portion 18 extending around the pad portion 19. The capacitance C can be tuned by selecting one or more of an area $A_1$ of the first conductive feature 12A, an area $A_2$ of the pad portion 19 of the second conductive feature 12B, a thickness t of the non-conductive feature 14, and/or the insulating material for the non-conductive material 14. The thickness t can be in a range of 0.1 microns to 2 microns. The non-conductive feature 14 can comprise any suitable insulating material, such as silicon oxide, etc.

As shown in FIGS. 3B and 3F, the inductive electrical pathway $P_L$ can be in series with the capacitive electrical pathway $P_C$. Returning to FIG. 3E, the second conductive feature 12B can be patterned to define the coil portion 18 that defines a plurality of turns about the z-axis, which can be perpendicular to the direct bond interface 13. The coil portion 18 can generate the inductance L in series with the capacitance C. As with the first and second conductive features 12A, 12B of FIGS. 2A-2F, the coil portion 18 can turn about the z-axis in a clockwise or counterclockwise direction. As compared with FIGS. 2A-2F, however, in the embodiment of FIGS. 3A-3F, the coil portion 18 can comprise more turns than the filter 14 FIGS. 2A-2F. For example, as shown in FIG. 3E, the coil portion 18 can loop around the pad portion 19 at least two times, at least three times, at least four times, at least five times, or at least 6 times. The number of turns of the coil portion 18 can be selected so as to tune the overall inductance L of the filter 15.

Further as shown in FIG. 3F, a fourth non-conductive feature 14D can be provided between segments of the coil portion 18 to electrically separate the coils as the coil portion 18 winds around the pad portion 19. The coil portion 18 can have a pitch p defined at least in part by a width $w_C$ of the conductive coil portion 18 and a width $w_N$ defined at least in part by the intervening fourth non-conductive portion 14D. The width $w_C$ of each coil of the coil portion 18 may be smaller than the width of the segments 17A-17C of the conductive portions 12A, 12B of FIGS. 2A-2F. For example, in various embodiments, the width $w_C$ of the conductive portion of each coil can be in a range of 0.1 microns to 50 microns. The width $w_N$ of the non-conductive portion 14D can be in a range of 0.1 microns to 50 microns. The pitch p of the coil portion can be in a range of 0.2 microns to 100 microns. Beneficially, the number of turns, the pitch p, and/or the widths $w_C$, $w_N$ can be selected so as to tune the inductance L of the interface structure 10.

As shown in FIG. 3E, the inductive electrical pathway $P_L$ can extend from the pad portion 19 and along the coils of the coil portion 18 disposed about the pad portion 19. The inductive pathway $P_L$ can exit the interface structure at the output terminal 6B and can be transferred to other devices and/or structures of the second element 3. Thus, as with the embodiment of FIGS. 2A-2F, in the embodiment of FIGS. 3A-3F, a filter 15 can be provided within and/or integrated with the interface structure 10 between two elements 2, 3.

FIG. 3G is a graph of gain versus frequency for the filter 15 shown and described in FIGS. 3A-3F. The embodiment of FIGS. 3A-3F can beneficially serve as a band pass filter or resonator in which signals at one or a plurality of frequencies are passed or transmitted, and signals at other frequencies are attenuated. As shown by the insertion loss plot of FIG. 3G, in this example, electrical signals at frequencies in a pass band between about 1.4 GHz and about 1.8 GHz can be passed or transmitted, while electrical signals at frequencies outside this pass band can be attenuated (e.g., blocked or reduced in amplitude). Beneficially, the performance of the filter 15 shown in FIG. 3G (e.g., the filter 15 of FIGS. 3A-3F) can provide a relatively narrow pass band that can accurately and selectively passes certain frequencies.

Figure 3H:
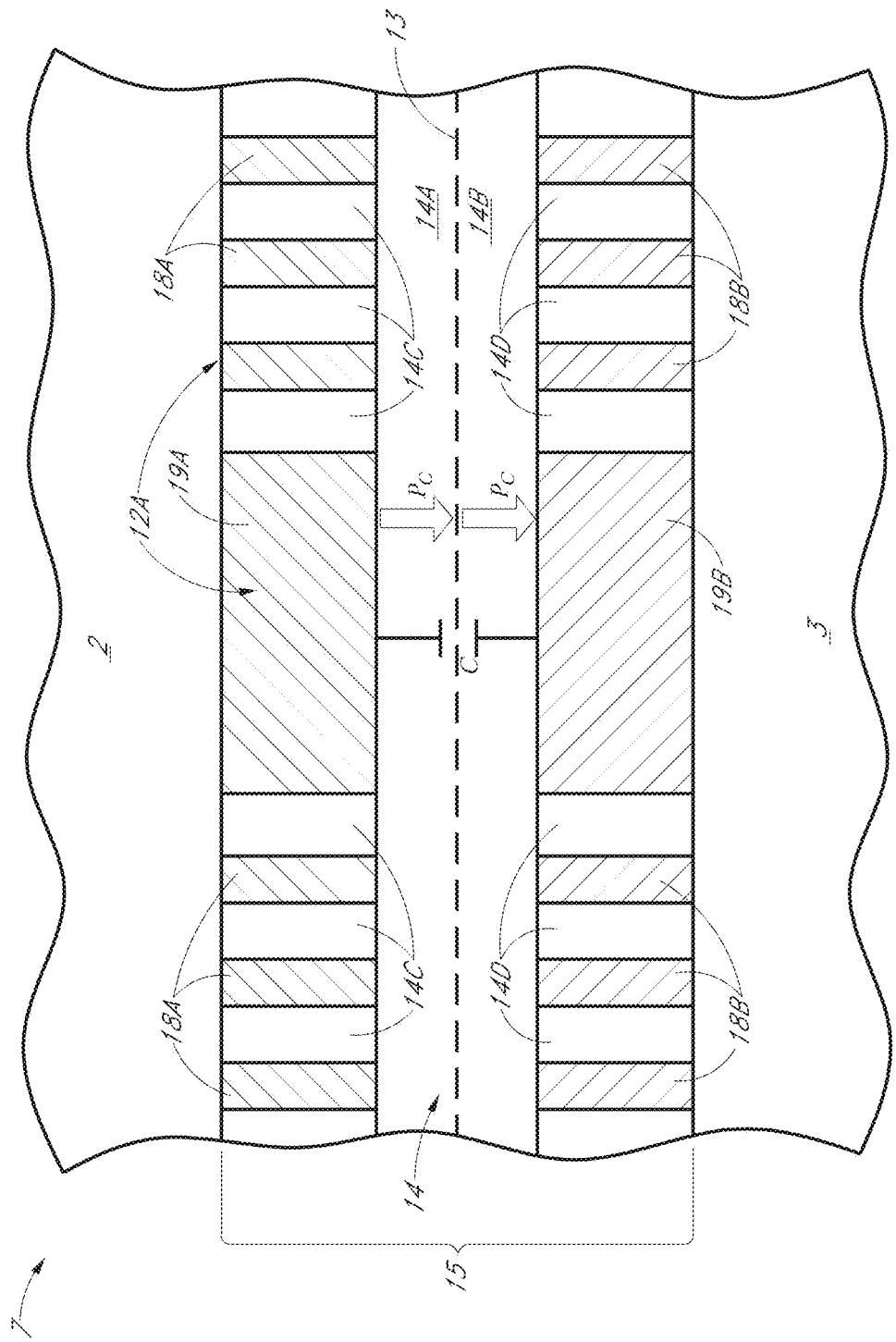
FIG. 3H is a schematic side sectional view of a filter, according to yet another embodiment.

FIG. 3H is a schematic side sectional view of a filter 15, according to yet another embodiment. Unless otherwise noted, the components of FIG. 3H may be the same as or generally similar to like numbered components of FIGS. 3A-3F. Unlike the embodiment of FIGS. 3A-3F (which can be modeled as a capacitor C in series with an inductor L, or an L-C circuit), in the embodiment of FIG. 3H, the filter 15 can be modeled as an inductor in series with a capacitor in series with another inductor, or L-C-L circuit. In the embodiment of FIGS. 3A-3F, the first conductive portion 12A comprises a pad embedded or surrounded by the non-conductive portion 14C. By contrast, in the embodiment of FIG. 3H, the first conductive portion 12A can comprise a first pad portion 19A and a first coil portion 18A disposed about the first pad portion 19A by a number of turns or coils. The coil portion 18A can comprise metallic portions separated by the third non-conductive feature 14C. As with the embodiment of FIGS. 3A-3F, the second conductive portion 12B can comprise a second pad portion 19A and a second coil portion 18B disposed about the second pad portion 19B by a number of turns or coils. A fourth non-conductive feature 14D can separate adjacent sections of the second coil portion 18B. Thus, in FIG. 3H, the first conductive feature 12A can comprise a first inductive pathway extending about the first coil portion 18A (similar to the inductive pathway disposed along the second conductive portion 12B shown in FIGS. 3A and 3E). A capacitive pathway $P_C$ can extend from the first conductive portion 12A, through the non-conductive portion 14, to the second conductive portion 12B. The second conductive portion 12B can comprise a second inductive pathway extending around the second coil portion 18B (similar to the inductive pathway disposed along the second conductive portion 12B shown in FIGS. 3A and 3E).

Thus, the embodiment of FIG. 3H can serve as an inductor-capacitor-inductor (L-C-L) series circuit. As with the embodiment of FIGS. 3A-3F, the first conductive feature 12A, the non-conductive feature 14, and the second conductive feature 12B can be tuned to achieve desired filter properties, e.g., desired inductances and a desired capacitance.

FIG. 4A is a schematic top plan view of a first conductive interface feature 12A, according to various embodiments. FIG. 4B is a schematic top plan view of a second conductive interface feature 12B, according to various embodiments. Unless otherwise noted, the conductive features 12A, 12B of FIGS. 4A and 4B can be generally similar to like-numbered components of FIGS. 2A-3H. For example, as with FIGS. 2A-2F, the first and second conductive features 12A, 12B can comprise a plurality of segments 17A-17G that define a plurality of turns about the z-axis, which can be perpendicular to the direct bond interface 13. In FIGS. 4A-4B, the segments 17A-17G can have a relatively large width w, as compared with the width we of the coil portion 18A of FIGS. 3A-3H. The larger width w of FIGS. 4A-4B can be tuned so as to adjust the inductance of the interface structure 10. In various embodiments, the width w of the segments 17A-17G can be in a range of 0.1 microns to 100 microns.

As shown in FIGS. 4A and 4B, the one or a plurality of contacts 33 can be provided on the first and/or second conductive features 12A, 12B. In various embodiments, the contacts 33 can provide input and/or output electrical signals to the respective conductive features 12A, 12B. In embodiments such as those shown in FIGS. 2A-2F, the contacts 33 can extend through the intervening non-conductive material 14 to provide an electrical pathway through the non-conductive material 14. In embodiments, such as those shown in FIGS. 3A-3H, the contacts 33 may not extend through the nonconductive material 14, but may instead serve as input and output terminals to series L-C (or L-C-L) circuitry.

Figure 5A:
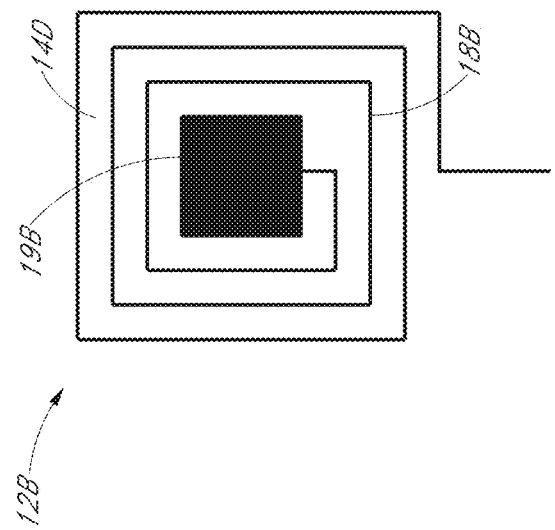
FIG. 5A is a schematic top plan view of a first conductive interface feature, according to another embodiment.
Figure 5B:
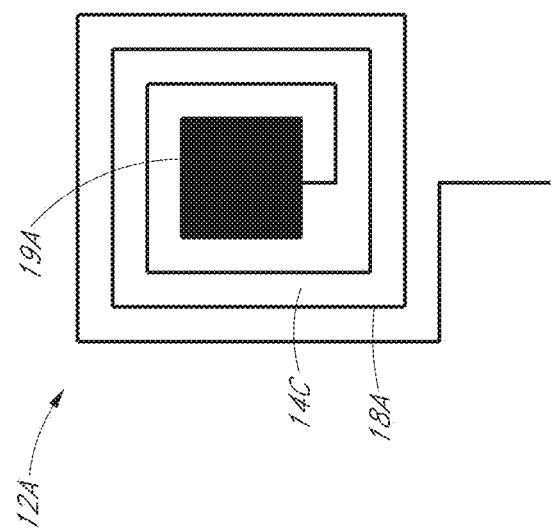
FIG. 5B is a schematic top plan view of a second conductive interface feature, according to another embodiment.

FIG. 5A is a schematic top plan view of a first conductive interface feature 12A, according to another embodiment. FIG. 5B is a schematic top plan view of a second conductive interface feature 12B, according to another embodiment. Unless otherwise noted, the conductive features 12A, 12B of FIGS. 5A and 5B can be generally similar to like-numbered components of FIGS. 2A-4B. As with the embodiment of FIG. 3H, for example, the first conductive feature 12A can comprise a first pad portion 19A and a first coil portion 18A extending about the first pad portion 19A. The third non-conductive feature 14C can be provided between adjacent sections or coils of the first coil portion 18A. Similarly, the second conductive feature 12B can comprise a second pad portion 19B and a second coil portion 18B extending about the second pad portion 19B. The fourth non-conductive feature 4D can be provided between adjacent sections or coils of the second coil portion 18B. Thus, the first and second conductive features 12A, 12B, and the third and fourth non-conductive features 14C, 14D can represent top plan views of the features shown in the embodiment of FIG. 3H (e.g., an L-C-L circuit in series) in various arrangements. In other arrangements, a conductive interconnect can connect the first and second conductive features 12A, 12B, in embodiments that utilize a parallel L-C arrangement. Unlike the arrangement of FIGS. 4A-4B, the width w of the coils of the coil portions 18A, 18B can be smaller than the corresponding widths w of the segments 17A-17G of FIGS. 4A-4B. The arrangement of FIGS. 5A-5B may include more turns that the arrangement of FIGS. 4A-4B.

Figure 6A:
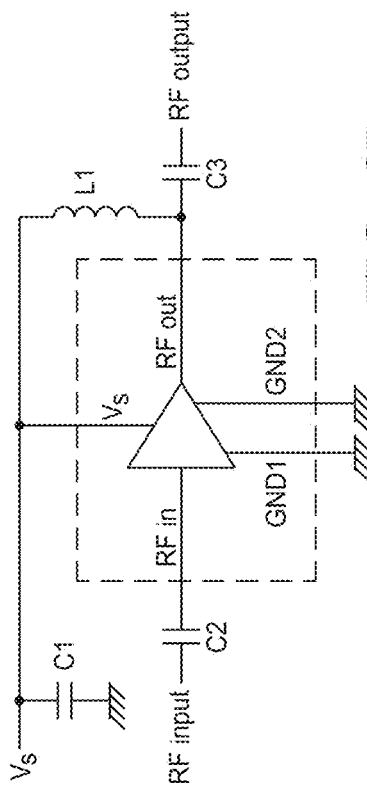
FIG. 6A is a top plan view of the conductive feature of FIG. 2A, which can be incorporated into various types of filters and devices.
Figure 6B:
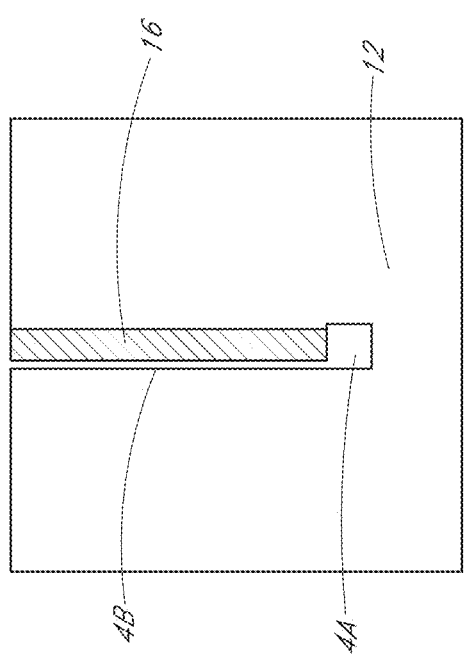
FIG. 6B is a schematic circuit diagram of a radio frequency (RF) power amplifier output low pass filter that can be used in conjunction with various embodiments disclosed herein.
Figure 6C:
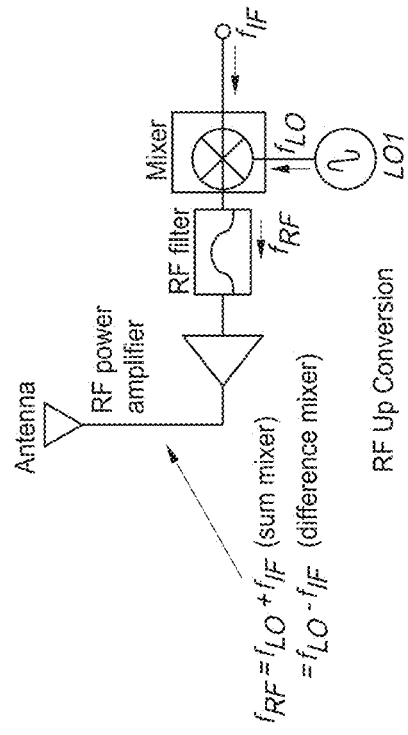
FIG. 6C is a schematic circuit diagram of an RF down conversion device that can be used in conjunction with various embodiments disclosed herein.
Figure 6D:
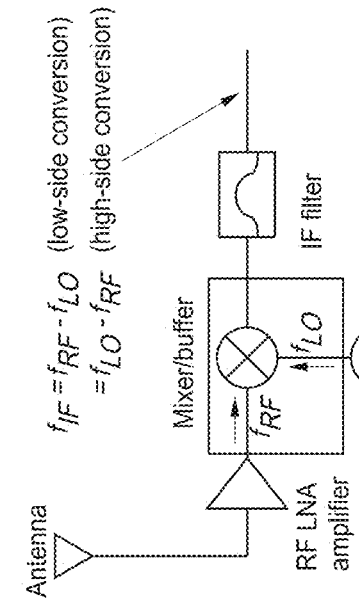
FIG. 6D is a schematic circuit diagram of an RF up conversion device that can be used in conjunction with various embodiments disclosed herein.

FIG. 6A is a top plan view of a conductive feature 12 (e.g., one of the conductive features 12A, 12B of FIG. 2A, which includes the conductive interconnect 16 that connects the first and second conductive features 12A, 12B through the nonconductive feature 14. As explained above, the conductive features 12, the nonconductive feature 14, and interconnect 16 can be utilized in the band reject filter 15 described above in connection with FIGS. 2A-2H. In other embodiments, however, the conductive features 12, the nonconductive feature 14, and interconnect 16 can be employed in other types of filters, such as low pass filters. For example, in some embodiments, the nonconductive feature 14 and interconnect 16 can be used in a radio frequency (RF) power amplifier output low pass filter, such as the filter shown in FIG. 6B. Beneficially, the relatively large contact area of the solid interconnect 16 (e.g., the relatively large contact area that the interconnect 16 provides between the first and second conductive features 12A, 12B) shown in FIG. 6A can enable the filter to handle relatively high power throughput (e.g., about 0.5 W to about 1 W). In still other embodiments, the conductive features 12 and interconnect 16 of FIG. 6A can be utilized in an RF transceiver mixer output low pass filter. For example, the embodiment of FIG. 6A can be utilized in an RF down conversion device such as that shown in FIG. 6C. In other arrangements, the embodiment of FIG. 6A can be utilized in an RF up conversion device such as that shown in FIG. 6D. Still other applications for the embodiment of FIG. 6A may be suitable.

Figure 6G:
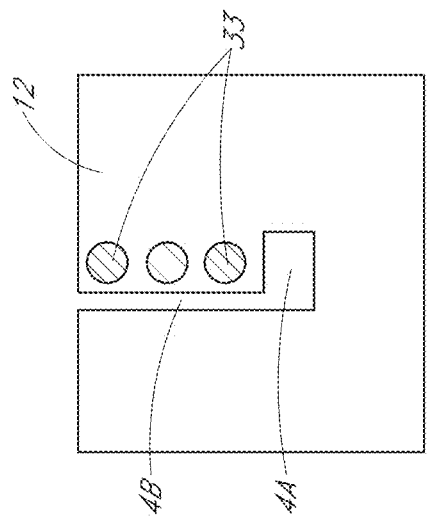
FIG. 6G is a top plan view of a conductive feature in which the contact comprises a plurality of rounded contacts.
Figure 6F:
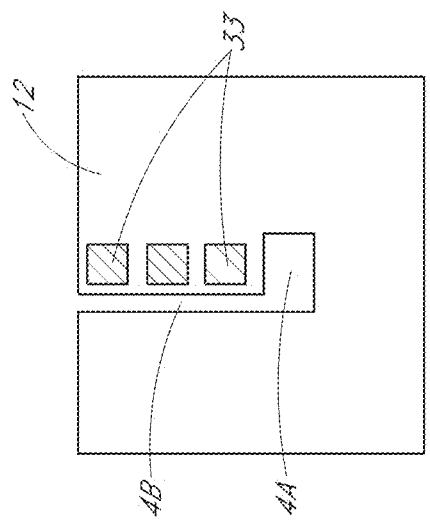
FIG. 6F is a top plan view of a conductive feature in which the contact comprises a plurality of polygonal contacts.
Figure 6E:
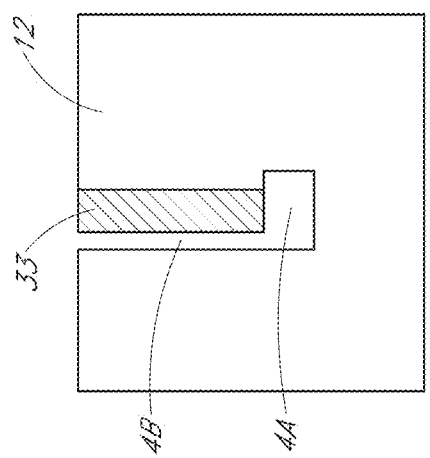
FIG. 6E is a top plan view of a conductive feature in which the contact comprises a continuous, single contact.

FIGS. 6E-6G illustrate various implementations of the conductive contact(s) 33 that can be provided on the first and/or second conductive features 12A, 12B. As explained above, the contact(s) 33 can serve as an electrical input and/or output to the respective conductive features 12A, 12B. In some embodiments, the contact(s) 33 can communicate with the interconnect 16 that extends through the non-conductive feature 14. FIG. 6E is a top plan view of a conductive feature 12 (which may comprise the first and/or second conductive feature 12A, 12B) in which the contact 33 comprises a continuous, single contact. FIG. 6F is a top plan view of a conductive feature 12 (which may comprise the first and/or second conductive feature 12A, 12B) in which the contact 33 comprises a plurality of polygonal contacts. FIG. 6G is a top plan view of a conductive feature 12 (which may comprise the first and/or second conductive feature 12A, 12B) in which the contact 33 comprises a plurality of rounded (e.g., circular or elliptical) contacts. In some embodiments, the single continuous contact 33 of FIG. 6E may be desirable, e.g., for high power applications. In other embodiments, the plurality of discrete contacts 33 of FIGS. 6F-6G may be desirable. For example, in some arrangements, if a larger contact 33 is polished, dishing may occur. To avoid or mitigate the effects of dishing, the plurality of discrete contacts 33 may be utilized. Still other sizes and shapes of the contact(s) 33 may be suitable.

Figure 7A:
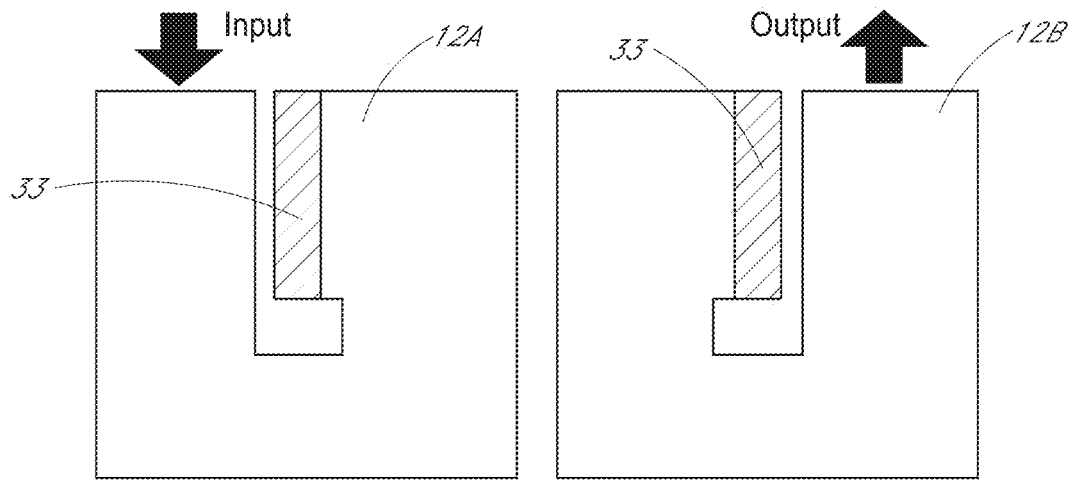
FIG. 7A is a schematic top view of first and second conductive features that can be used in conjunction with the band-reject filter of FIGS. 2A-2F.
Figure 7B:
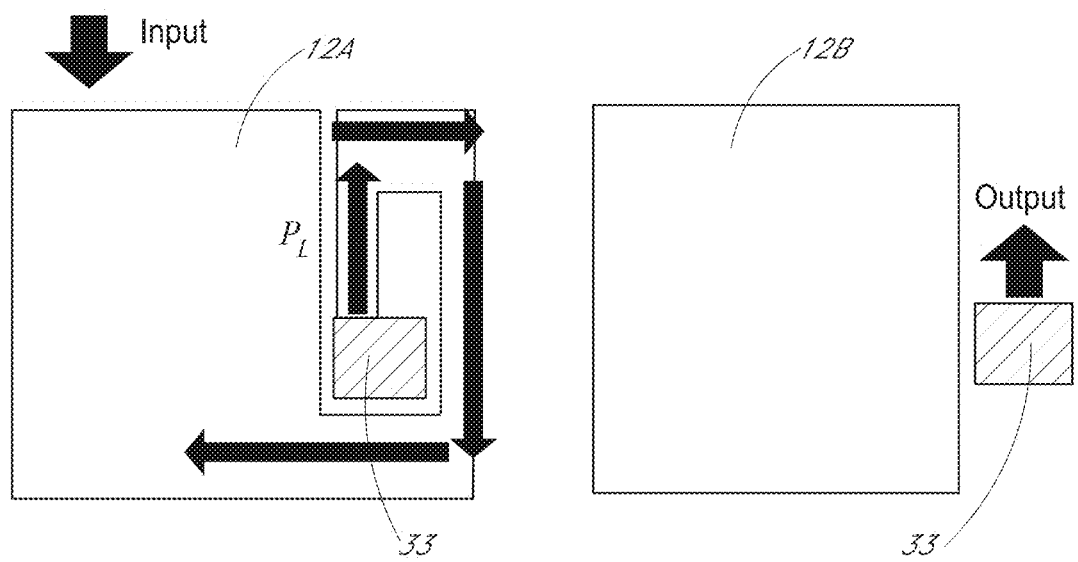
FIG. 7B is a schematic top view of the first and second conductive features that can be patterned to define a band pass filter, similar to the band pass filter described in FIGS. 3A-3G.

FIG. 7A is a schematic top view of first and second conductive features 12A, 12B that can be used in conjunction with the band-reject filter 15 of FIGS. 2A-2F. FIG. 7B is a schematic top view of the first and second conductive features 12A, 12B that can be patterned to define a band pass filter 15, similar to the band pass filter 15 described above in FIGS. 3A-3G. FIGS. 7A-7B illustrate that the first and second conductive features 12A, 12B can be patterned to define any suitable type of filter. For example, the pattern of the conductive features 12A, 12B of FIG. 7A can be used with a band-reject filter. Similarly, the pattern of the conductive features 12A, 12B of FIG. 7B can be used with a band-pass filter. Still other patterns for the conductive features 12A, 12B may be suitable for defining filters and other electronic components between the elements 2, 3.

In one embodiment, a stacked and electrically interconnected structure is disclosed. The stacked and electrically interconnected structure can comprise a first element and a second element directly bonded to the first element along a bonding interface without an intervening adhesive. The filter circuit can be integrally formed between the first and second elements along the bonding interface.

In another embodiment, a stacked and electrically interconnected structure is disclosed. The stacked and electrically interconnected structure can comprise a first element and a second element mounted to the first element. The stacked and electrically interconnected structure can comprise an interface structure between the first and second elements. The interface structure can mechanically and electrically connect the first and second elements. The interface structure can comprise a filter circuit integrated within the interface structure. The filter circuit can be configured to pass electrical signals at a first range of frequencies and to attenuate electrical signals at a second range of frequencies.

In another embodiment, a stacked and electrically interconnected structure is disclosed. The stacked and electrically interconnected structure can comprise a first element and a second element mounted to the first element. The stacked and electrically interconnected structure can comprise an interface structure between the first and second elements. The interface structure can mechanically and electrically connect the first and second elements. The interface structure can comprise an inductive electrical pathway between the first element and the second element and a capacitive electrical pathway between the first element and the second element.

For purposes of summarizing the disclosed embodiments and the advantages achieved over the prior art, certain objects and advantages have been described herein. Of course, it is to be understood that not necessarily all such objects or advantages may be achieved in accordance with any particular embodiment. Thus, for example, those skilled in the art will recognize that the disclosed implementations may be embodied or carried out in a manner that achieves or optimizes one advantage or group of advantages as taught or suggested herein without necessarily achieving other objects or advantages as may be taught or suggested herein.

All of these embodiments are intended to be within the scope of this disclosure. These and other embodiments will become readily apparent to those skilled in the art from the following detailed description of the embodiments having reference to the attached figures, the claims not being limited to any particular embodiment(s) disclosed. Although this certain embodiments and examples have been disclosed herein, it will be understood by those skilled in the art that the disclosed implementations extend beyond the specifically disclosed embodiments to other alternative embodiments and/or uses and obvious modifications and equivalents thereof. In addition, while several variations have been shown and described in detail, other modifications will be readily apparent to those of skill in the art based upon this disclosure. It is also contemplated that various combinations or sub-combinations of the specific features and aspects of the embodiments may be made and still fall within the scope. It should be understood that various features and aspects of the disclosed embodiments can be combined with, or substituted for, one another in order to form varying modes of the disclosed implementations. Thus, it is intended that the scope of the subject matter herein disclosed should not be limited by the particular disclosed embodiments described above, but should be determined only by a fair reading of the claims that follow.

What is claimed is:

1. A stacked and electrically interconnected structure comprising:
   a first element comprising a first non-conductive feature; and
   a second element comprising a second non-conductive feature, the second non-conductive feature directly bonded to the first non-conductive feature of the first element along a bonding interface without an intervening adhesive,
   wherein a filter circuit is integrally formed vertically between the first and second elements along the bonding interface.

2. The structure of claim 1, further comprising an interface structure between the first and second elements, the interface structure comprising the bonding interface, wherein the filter circuit includes an inductive electrical pathway between the first element and the second element and a capacitive electrical pathway between the first element and the second element.

3. The structure of claim 2, wherein the inductive electrical pathway is in parallel with the capacitive electrical pathway.

4. The structure of claim 3, wherein the interface structure comprises a first conductive interface feature, a second conductive interface feature, and a non-conductive interface feature disposed between the first and second conductive interface features the non-conductive interface feature comprising at least one of the first and second non-conductive features.

5. The structure of claim 4, further comprising a conductive interconnect extending from the first conductive interface feature, through the non-conductive interface feature, to the second conductive interface feature, the inductive electrical pathway extending along the first conductive interface feature, the conductive interconnect, and the second conductive interface feature.

6. The structure of claim 5, wherein at least one of the first and second conductive interface features comprises at least one turn about an axis perpendicular to the bonding interface.

7. The structure of claim 4, wherein the capacitive electrical pathway extends along the first conductive interface feature, the non-conductive interface feature, and the second conductive interface feature.

8. The structure of claim 2, wherein the inductive electrical pathway is in series with the capacitive electrical pathway.

9. The structure of claim 8, wherein the interface structure comprises a first conductive interface feature, a second conductive interface feature, and a non-conductive interface feature disposed between the first and second conductive interface features, wherein the inductive electrical pathway is disposed along the second conductive interface feature and wherein the capacitive electrical pathway extends along the first conductive interface feature, the non-conductive interface feature, and the second conductive interface feature, the non-conductive interface feature comprising at least one of the first and second non-conductive features.

10. The structure of claim 9, wherein the second conductive interface feature comprises at least one turn about an axis perpendicular to the bonding interface.

11. The structure of claim 9, wherein the filter circuit includes a second inductive electrical pathway between the first and second elements, the second inductive electrical pathway in series with the capacitive electrical pathway and the inductive electrical pathway.

12. The structure of claim 11, wherein the second inductive electrical pathway is disposed along the first conductive interface feature.

13. A stacked and electrically interconnected structure comprising:
   a first element comprising a first non-conductive feature; and
   a second element comprising a second non-conductive feature, the second non-conductive feature directly bonded to the first non-conductive feature of the first element; and
   an interface structure disposed vertically between the first and second elements, the interface structure mechanically and electrically connecting the first and second elements, the interface structure comprising a filter circuit integrated within the interface structure, the filter circuit configured to pass electrical signals at a first range of frequencies and to attenuate electrical signals at a second range of frequencies.

14. The structure of claim 13, wherein the filter circuit includes an inductive electrical pathway between the first element and the second element and a capacitive electrical pathway between the first element and the second element.

15. The structure of claim 14, wherein the inductive electrical pathway is in parallel with the capacitive electrical pathway.

16. The structure of claim 15, wherein the interface structure comprises a first conductive interface feature, a second conductive interface feature, and a non-conductive interface feature disposed between the first and second conductive interface features the non-conductive interface feature comprising at least one of the first and second non-conductive features.

17. The structure of claim 16, further comprising a conductive interconnect extending from the first conductive interface feature, through the non-conductive interface feature, to the second conductive interface feature, the inductive electrical pathway extending along the first conductive interface feature, the conductive interconnect, and the second conductive interface feature.

18. The structure of claim 17, wherein at least one of the first and second conductive interface features comprises at least one turn about an axis perpendicular to the bonding interface.

19. The structure of claim 16, wherein the capacitive electrical pathway extends along the first conductive interface feature, the non-conductive interface feature, and the second conductive interface feature.

20. The structure of claim 13, wherein the inductive electrical pathway is in series with the capacitive electrical pathway.

21. The structure of claim 20, wherein the interface structure comprises a first conductive interface feature, a second conductive interface feature, and a non-conductive interface feature disposed between the first and second conductive interface features, wherein the inductive electrical pathway is disposed along the second conductive interface feature and wherein the capacitive electrical pathway extends along the first conductive interface feature, the non-conductive interface feature, and the second conductive interface feature, the non-conductive interface feature comprising at least one of the first and second non-conductive features.

22. A stacked and electrically interconnected structure comprising:
a first element comprising a first non-conductive feature; and
a second element comprising a second non-conductive feature, the second non-conductive feature directly bonded to the first non-conductive feature of the first element; and
an interface structure disposed vertically between the first and second elements, the interface structure mechanically and electrically connecting the first and second elements, the interface structure comprising an inductive electrical pathway between the first element and the second element and a capacitive electrical pathway between the first element and the second element.

23. The structure of claim 22, wherein the inductive electrical pathway is in series with the capacitive electrical pathway.

24. The structure of claim 22, wherein the inductive electrical pathway is in parallel with the capacitive electrical pathway.

* * * * *